(12) United States Patent
Aygun et al.

(10) Patent No.: US 11,854,490 B1
(45) Date of Patent: Dec. 26, 2023

(54) DISPLAYS WITH GATE DRIVER CIRCUITRY IN AN ACTIVE AREA

(71) Applicant: Apple Inc., Cupertino, CA (US)

(72) Inventors: Levent Erdal Aygun, Cupertino, CA (US); Chin-Wei Lin, San Jose, CA (US); Yun Wang, Cupertino, CA (US); Xin Lin, Princeton, NJ (US); Aida R Colon-Berrios, Cupertino, CA (US); Shih Chang Chang, Cupertino, CA (US); Fan Gui, San Jose, CA (US); Mohammad Reza Esmaeili Rad, San Jose, CA (US); Ran Tu, San Jose, CA (US); Warren S Rieutort-Louis, Cupertino, CA (US); Abbas Jamshidi Roudbari, Saratoga, CA (US); Bhadrinarayana Lalgudi Visweswaran, San Mateo, CA (US); Cheng-Chih Hsieh, Santa Clara, CA (US); Ricardo A Peterson, Fremont, CA (US); Shyuan Yang, San Mateo, CA (US); Ting-Kuo Chang, San Jose, CA (US); Tsung-Ting Tsai, San Jose, CA (US); Yuchi Che, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/879,642

(22) Filed: Aug. 2, 2022

Related U.S. Application Data

(60) Provisional application No. 63/355,047, filed on Jun. 23, 2022, provisional application No. 63/233,542, filed on Aug. 16, 2021.

(51) Int. Cl.
G09G 3/3266 (2016.01)
G09G 3/00 (2006.01)
H01L 27/12 (2006.01)

(52) U.S. Cl.
CPC ............ *G09G 3/3266* (2013.01); *G09G 3/007* (2013.01); *H01L 27/124* (2013.01);
(Continued)

(58) Field of Classification Search
CPC .................. G09G 3/3266; G09G 3/007; G09G 2300/0452; G09G 2300/0861;
(Continued)

(56) References Cited

U.S. PATENT DOCUMENTS

| 7,355,606 B2 | 4/2008 | Paquette |
| 7,781,979 B2 | 8/2010 | Lys |

(Continued)

*Primary Examiner* — Nitin Patel
*Assistant Examiner* — Amen W Bogale
(74) *Attorney, Agent, or Firm* — Treyz Law Group, P.C.; Joseph F. Guihan

(57) ABSTRACT

To reduce the amount of space occupied in the inactive area of a display by gate driver circuitry, at least a portion of the gate driver circuitry may be positioned in the active area of the display. To accommodate the gate driver circuitry, emissive sub-pixels may be laterally shifted relative to corresponding thin-film transistor sub-pixels. This allows for the thin-film transistor sub-pixels to be grouped adjacent to the central area of the active area, leaving room along an edge of the active area to accommodate one or more additional display components such as gate driver circuitry or fanout portions of data lines.

15 Claims, 23 Drawing Sheets

(52) U.S. Cl.
CPC .............. *G09G 2300/0452* (2013.01); *G09G 2300/0861* (2013.01); *G09G 2310/0286* (2013.01); *G09G 2320/0626* (2013.01); *G09G 2330/021* (2013.01)

(58) Field of Classification Search
CPC ... G09G 2310/0286; G09G 2320/0626; G09G 2330/021; H01L 27/124
See application file for complete search history.

(56) References Cited

U.S. PATENT DOCUMENTS

| | | | |
|---|---|---|---|
| 7,940,457 B2 | 5/2011 | Jain et al. | |
| 8,531,118 B2 | 9/2013 | Miskin et al. | |
| 8,724,942 B2 | 5/2014 | Logunov et al. | |
| 9,098,136 B2 | 8/2015 | Kim | |
| 9,780,157 B2 | 10/2017 | Kwon et al. | |
| 10,043,451 B2 | 8/2018 | Lee et al. | |
| 10,268,884 B2 | 4/2019 | Jones et al. | |
| 10,516,016 B2 | 12/2019 | Kim et al. | |
| 2014/0375704 A1 | 12/2014 | Bi et al. | |
| 2015/0241705 A1 | 8/2015 | Abovitz et al. | |
| 2015/0310801 A1* | 10/2015 | Lin | H10K 59/123 |
| | | | 345/205 |
| 2017/0116934 A1 | 4/2017 | Tien et al. | |
| 2017/0179432 A1 | 6/2017 | Visweswaran et al. | |
| 2019/0041658 A1 | 2/2019 | Gollier et al. | |
| 2019/0058151 A1* | 2/2019 | Zeng | H10K 50/125 |
| 2019/0094541 A1 | 3/2019 | Choi et al. | |
| 2019/0228734 A1* | 7/2019 | Gao | G02F 1/13624 |
| 2021/0359078 A1* | 11/2021 | Kim | H10K 59/1315 |
| 2021/0359079 A1* | 11/2021 | Jo | H01L 25/167 |
| 2021/0384468 A1 | 12/2021 | Mandlik et al. | |
| 2022/0069037 A1* | 3/2022 | Kim | H01L 27/3246 |
| 2022/0189410 A1* | 6/2022 | Kim | G09G 3/3233 |
| 2022/0310760 A1* | 9/2022 | Park | H10K 59/131 |
| 2023/0317021 A1* | 10/2023 | Eash | G09G 3/2003 |
| | | | 345/102 |

\* cited by examiner

DISPLAYS WITH GATE DRIVER CIRCUITRY IN AN ACTIVE AREA

This application claims the benefit of provisional patent application No. 63/233,542, filed Aug. 16, 2021, and provisional patent application No. 63/355,047, filed Jun. 23, 2022, which are hereby incorporated by reference herein in their entireties.

BACKGROUND

This relates generally to displays, and, more particularly, to displays with gate driver circuitry.

Electronic devices often include displays. For example, cellular telephones and portable computers include displays for presenting information to users. An electronic device may have an organic light-emitting diode display based on organic-light-emitting diode pixels or a liquid crystal display based on liquid crystal pixels.

Displays may include driving circuitry that is used to provide signals to the display to operate the display. If care is not taken, the driving circuitry may have a larger than desired footprint and may undesirably increase the size of an inactive border region of the display.

It would therefore be desirable to be able to provide improved driver circuitry for electronic device displays.

SUMMARY

An electronic device may include a display such as a light-emitting diode display. The display may include an array of pixels formed in an active area of the display, display driver circuitry that is configured to provide image data to the pixels, and gate driver circuitry that is configured to provide control signals to the pixels. The gate driver circuitry may include one or more drivers formed by shift registers that include a plurality of register circuits.

To reduce the amount of space occupied in the inactive area of the display by the gate driver circuitry, at least a portion of the gate driver circuitry may be positioned in the active area of the display. To accommodate the gate driver circuitry, the active area may include a low pixel-density region with a lower pixel density than the remainder of the display. The low pixel-density region may be positioned along an edge of the active area.

In the low pixel-density region, emissive sub-pixels may be laterally shifted relative to corresponding thin-film transistor sub-pixels. This allows for the thin-film transistor sub-pixels and/or the emissive sub-pixels to be grouped adjacent to the central area of the active area, leaving room along an edge of the active area to accommodate one or more additional display components such as gate driver circuitry or fanout portions of data lines.

The active area may include a smoothing region between the normal pixel-density region and the low pixel-density region. In the smoothing region, there may be a brightness gradient from the normal pixel-density region to the low pixel-density region to gradually match the pattern of the low pixel-density region.

In some displays, the active area may have a uniform density of emissive sub-pixels across the light-emitting area. Emissive sub-pixels may be laterally shifted relative to corresponding thin-film transistor sub-pixels to accommodate one or more additional display components such as gate driver circuitry or fanout portions of data lines.

DETAILED DESCRIPTION

Figure 1:
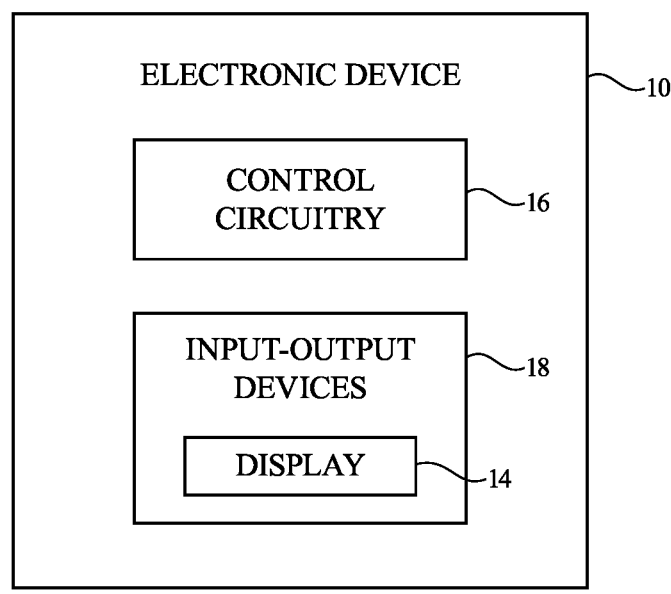
FIG. 1 is a schematic diagram of an illustrative electronic device having a display in accordance with some embodiments.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, an augmented reality (AR) headset and/or virtual reality (VR) headset, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be an organic light-emitting diode display, a display formed from an array of discrete light-emitting diodes each formed from a crystalline semiconductor die, or any other suitable type of display. Configurations in which the pixels of display 14 include light-emitting diodes are sometimes described herein as an example. This is, however, merely illustrative. Any suitable type of display may be used for device 10, if desired (e.g., a liquid crystal display).

In some cases, electronic device 10 may be a wristwatch device. Display 14 of the wristwatch device may be positioned in a housing. A wristwatch strap may be coupled to the housing.

Figure 2:
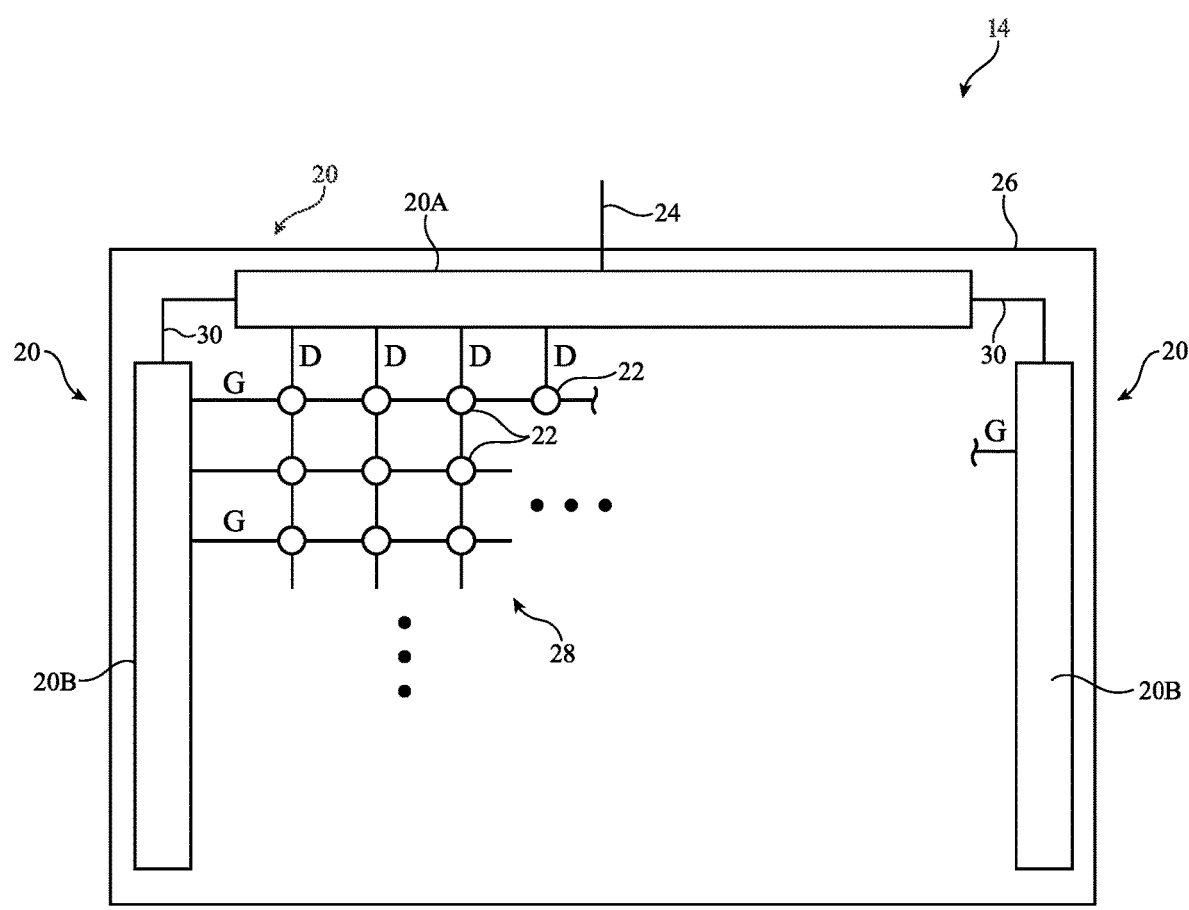
FIG. 2 is a schematic diagram of an illustrative display in accordance with some embodiments.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 (sometimes referred to as active area 28) may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. If desired, a backlight unit may provide backlight illumination for display 14.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 in an inactive area of the display as shown in FIG. 2. Gate driver circuitry 20B may include gate drivers and emission drivers.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, the control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D (e.g., vertical signal lines) while issuing control signals to supporting display driver circuitry such as gate driver circuitry 20B over signal paths 30. With the illustrative arrangement of FIG. 2, data lines D run vertically through display 14 and are associated with respective columns of pixels 22. During compensation operations, column driver circuitry 20 may use paths such as data lines D to supply a reference voltage.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.). The number of horizontal signal lines in each row may be determined by the number of transistors in the display pixels 22 that are being controlled independently by the horizontal signal lines. Display pixels of different configurations may be operated by different numbers of control lines, data lines, power supply lines, etc.

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Figure 3:
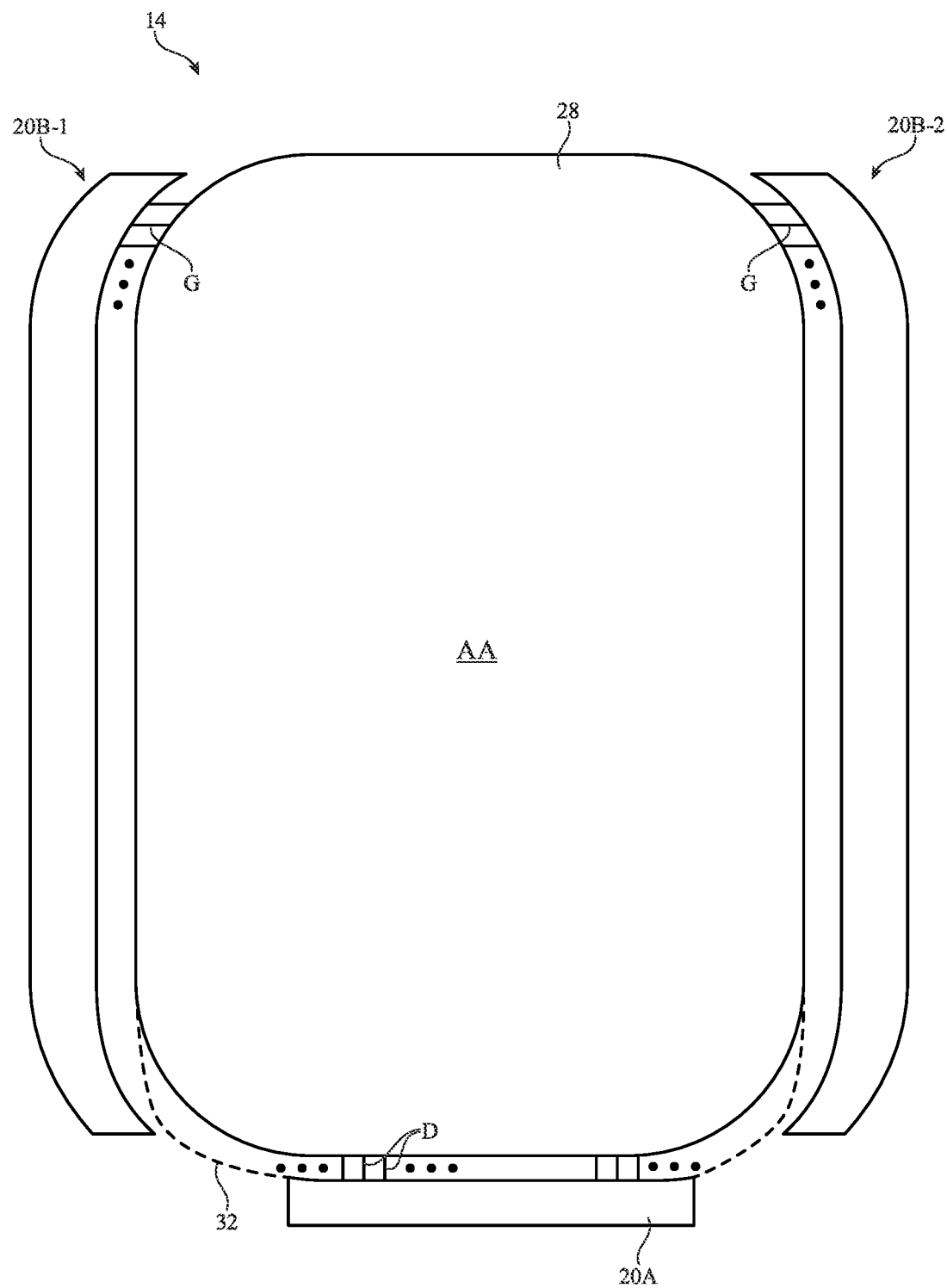
FIG. 3 is a top view of an illustrative display having gate driver circuitry on both sides of the display in accordance with some embodiments.

FIG. 3 shows a top view of an illustrative display with gate driver circuitry. Gate driver circuitry 20B may be formed along one or more edges of display 14. FIG. 3 shows an example where gate driver circuitry 20B is formed on first and second opposing sides of pixel array 28 (sometimes referred to as an active area AA). In other words, first gate driver circuitry 20B-1 is formed on the left side of the active area AA and second gate driver circuitry 20B-2 is formed on the right side of the active area AA.

Gate driver circuitry 20B-1 and 20B-2 may be configured to supply control signals to each pixel in the display. For example, gate driver circuitry 20B-1 and 20B-2 may supply control signals such as scanning control signals and emission control signals to the gates of transistors within each pixel. Gate driver circuitry 20B-1 and 20B-2 may each contain a shift register formed from a chain of register circuits. Each register circuit may supply control signals (e.g., switching transistor control signals, emission enable signals, etc.) to a corresponding row of pixels. During operation, control circuitry 16 (e.g., display driver circuitry 20A) may initiate propagation of a control pulse through the shift register. As the control pulse propagates through the shift register, each gate line may be activated in sequence, allowing successive rows of pixels 22 to be loaded with data from data lines D. Each register circuit may be referred to as a stage of the shift register.

In the example of FIG. 3, active area AA has a rectangular shape with rounded corners. This example is merely illustrative and in general the active area may have any desired shape.

As shown, the display also includes display driver circuitry 20A. Display driver circuitry 20A may supply corresponding image data to data lines D (e.g., vertical signal lines). Each data line D may be coupled to a respective column of pixels within the pixel array 28. However, as shown in FIG. 3, the width of display driver circuitry 20A may be less than the width of the active area AA. Accordingly, in order to provide data to all of the pixel columns, a fanout region 32 is used. In the fanout region, data lines D are spread out from display driver circuitry 20A to reach all of the columns in the pixel array. With the data line fanout region, the data lines are coupled to pixel columns in the rounded corner areas of the display.

In the arrangement of FIG. 3, gate driver circuitry 20B-1 and 20B-2 and data line fanout region 32 are all formed in the inactive area of the display. The inactive area of the display is an area of the display without pixels. The inactive area of the display therefore does not emit light. In general, it may be desirable to minimize the size of the inactive area of the display (e.g., to allow the active area of the display to occupy a maximum amount of relative area of the front face of the device). The gate driver circuitry 20B-1 and 20B-2 and data line fanout region 32 therefore undesirably increase the required size of the inactive area of the display.

Figure 4:
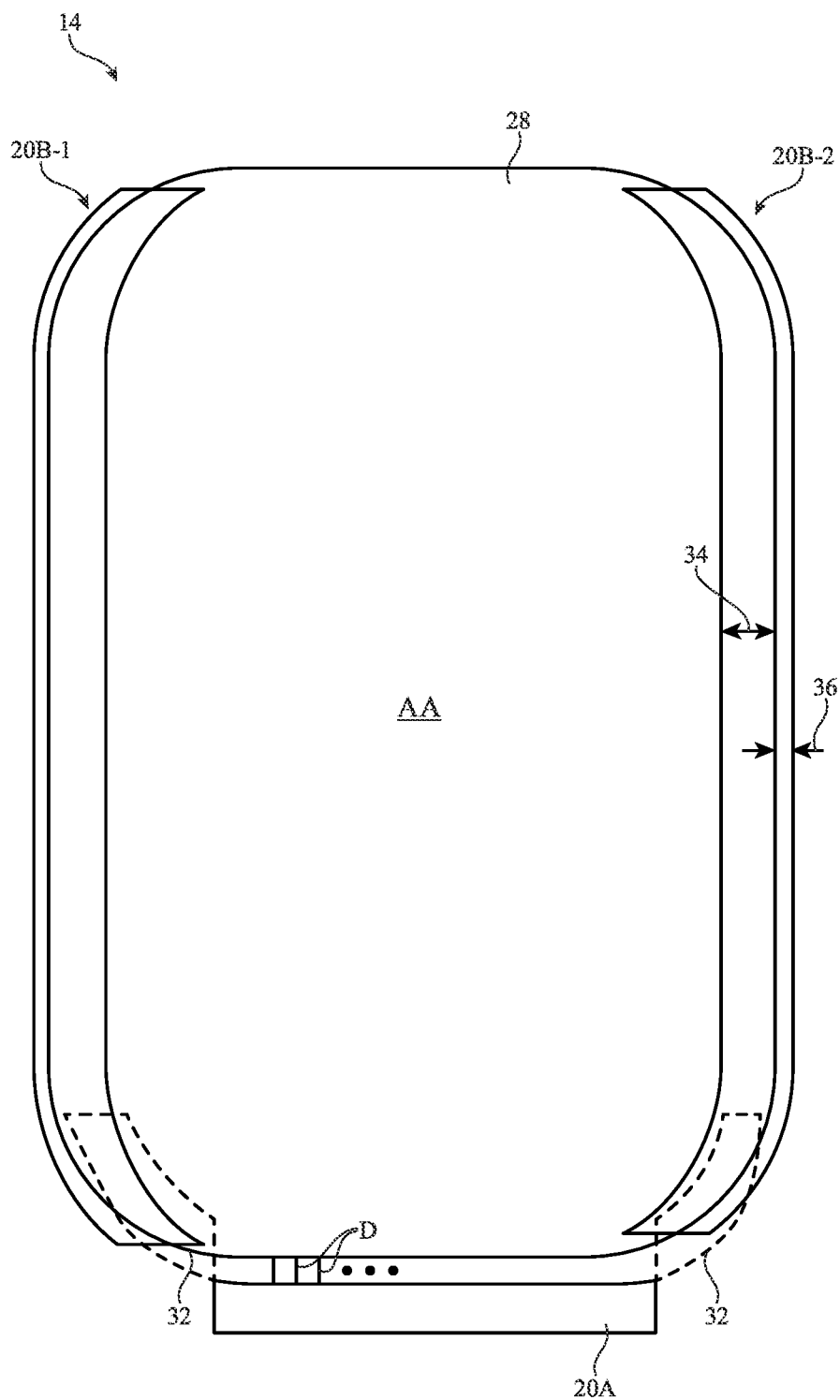
FIG. 4 is a top view of an illustrative display having gate driver circuitry in a light-emitting area of the display in accordance with some embodiments.

To reduce the size of the inactive area, gate driver circuitry 20B-1, gate driver circuitry 20B-2, and/or data line fanout region 32 may be at least partially formed in the active area of the display. FIG. 4 is a top view of an illustrative display with gate driver circuitry 20B-1, gate driver circuitry 20B-2, and data line fanout region 32 formed in active area AA. As shown, gate driver circuitry 20B-2 extends into active area AA by distance 34 along the right edge of the active area. In other words, the right edge of active area AA overlaps gate driver circuitry 20B-2 (e.g., the active area may at least partially overlap a shift register included in gate driver circuitry 20B-2).

As shown in FIG. 4, gate driver circuitry 20B-2 may be partially but not entirely formed in active area AA. The gate driver circuitry 20B-2 has a portion with a width 36 that is formed in the inactive area of the display. In general, distances 34 and 36 may have any desired magnitudes. Distance 34 may be at least 50 microns, at least 100 microns, at least 150 microns, at least 200 microns, at least 300 microns, at least 500 microns, at least 600 microns, less than 750 microns, less than 300 microns, etc. Distance 36 may be at least 50 microns, at least 100 microns, at least 150 microns, at least 200 microns, at least 300 microns, at least 500 microns, at least 600 microns, less than 750 microns, less than 300 microns, etc.

Similar to gate driver circuitry 20B-2, gate driver circuitry 20B-1 extends into active area AA along the left edge of the active area. Instead or in addition, data line fanout region 32 may be formed in the active area AA in the rounded corner areas of the active area (e.g., the lower left rounded corner and/or the lower right rounded corner).

To accommodate the components formed in the active area such as gate driver circuitry (such as circuitry 20B-1 or 20B-2) and/or data lines (e.g., in the data line fanout region), the pixel array may be modified. In particular, thin-film transistor sub-pixels in the display may be removed at the edges of the pixel array to provide additional space for the gate driver circuitry and/or data lines. Emissive sub-pixels may be included at the edges of the pixel array at a lower density than in the normal portion of the active area. This technique to allow components such as gate driver circuitry and/or data lines to be formed in the active area is described in more detail in connection with FIGS. 5-6.

Each display pixel 22 may include both a thin-film transistor layer and an emissive layer. Each emissive layer portion may have associated circuitry on the thin-film transistor layer that controls the magnitude of light emitted from that emissive layer portion. Both the emissive layer and thin-film transistor layer may have corresponding sub-pixels within the pixel. Each sub-pixel may be associated with a different color of light (e.g., red, green, and blue). The emissive layer portion for a given sub-pixel does not necessarily need to have the same footprint as its associated thin-film transistor layer portion. Hereinafter, the term sub-pixel may sometimes be used to refer to the combination of an emissive layer portion and a thin-film transistor layer portion. Additionally, the thin-film transistor layer may be referred to as having thin-film transistor sub-pixels (e.g., a portion of the thin-film transistor layer that controls a respective emissive area, sometimes referred to as thin-film transistor layer pixels, thin-film transistor layer sub-pixels or simply sub-pixels) and the emissive layer may be referred to as having emissive layer sub-pixels (sometimes referred to as emissive pixels, emissive sub-pixels or simply sub-pixels).

Figure 5A:
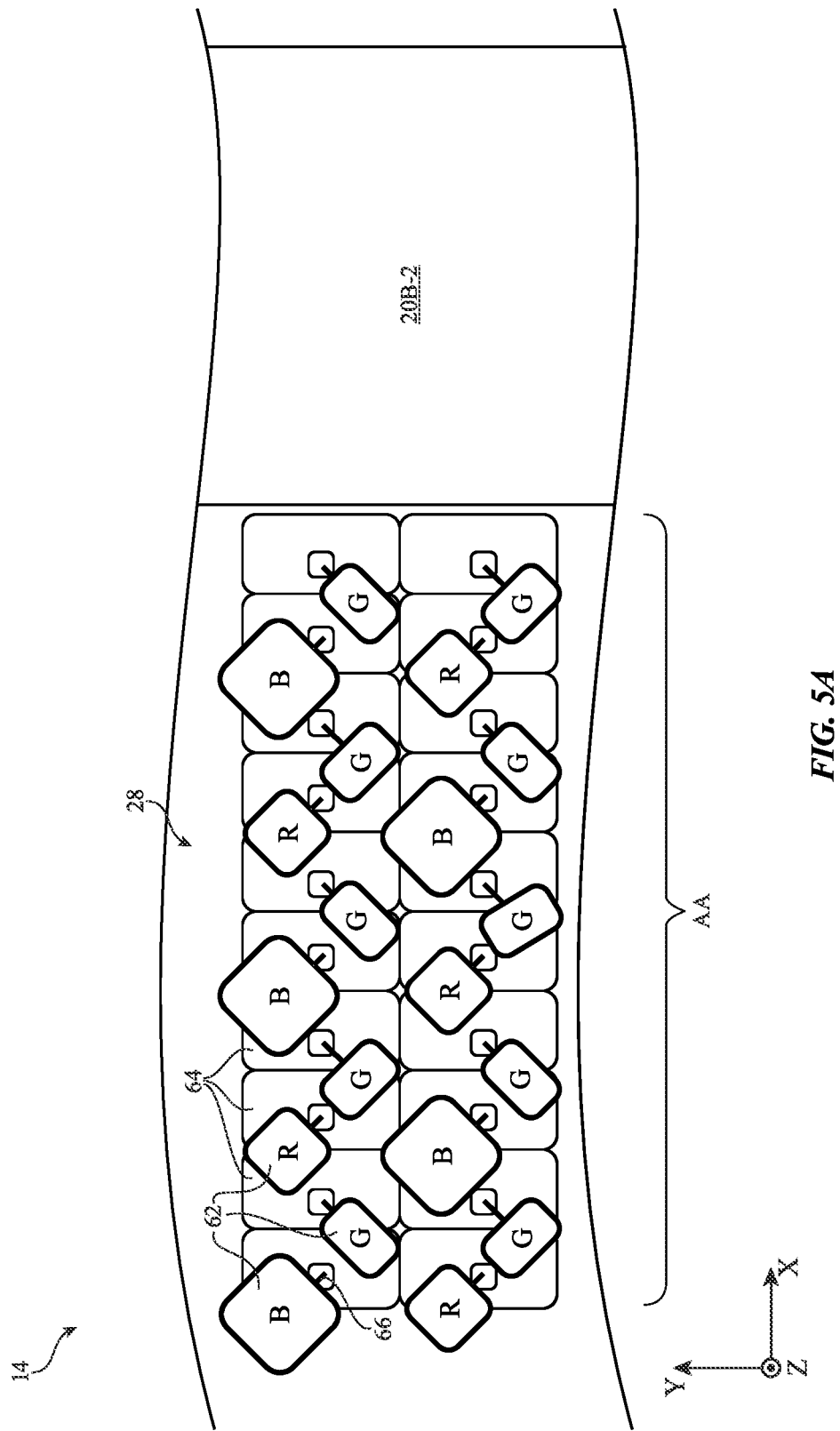
FIG. 5A is a top view of an illustrative display having emissive sub-pixels that overlap respective thin-film transistor sub-pixels in accordance with some embodiments.

FIG. 5A is a top view of an illustrative pixel array of the type shown in FIG. 3. In FIG. 5A, active area AA includes a pixel array that has the same pattern up to the edge of the active area. Outside the active area, gate driver circuitry 20B-2 is formed.

As shown in FIG. 5A, the pixel array 28 includes emissive sub-pixels 62 such as red (R), green (G), and blue (B) emissive sub-pixels 62. Each emissive sub-pixel 62 has a corresponding thin-film transistor sub-pixel 64. A contact 66 is shown for each thin-film transistor sub-pixel demonstrating how the thin-film transistor sub-pixel is electrically connected to a respective emissive sub-pixel. In FIG. 5A, each thin-film transistor sub-pixel 64 controls one corresponding emissive sub-pixel that overlaps that thin-film transistor sub-pixel.

Figure 5B:
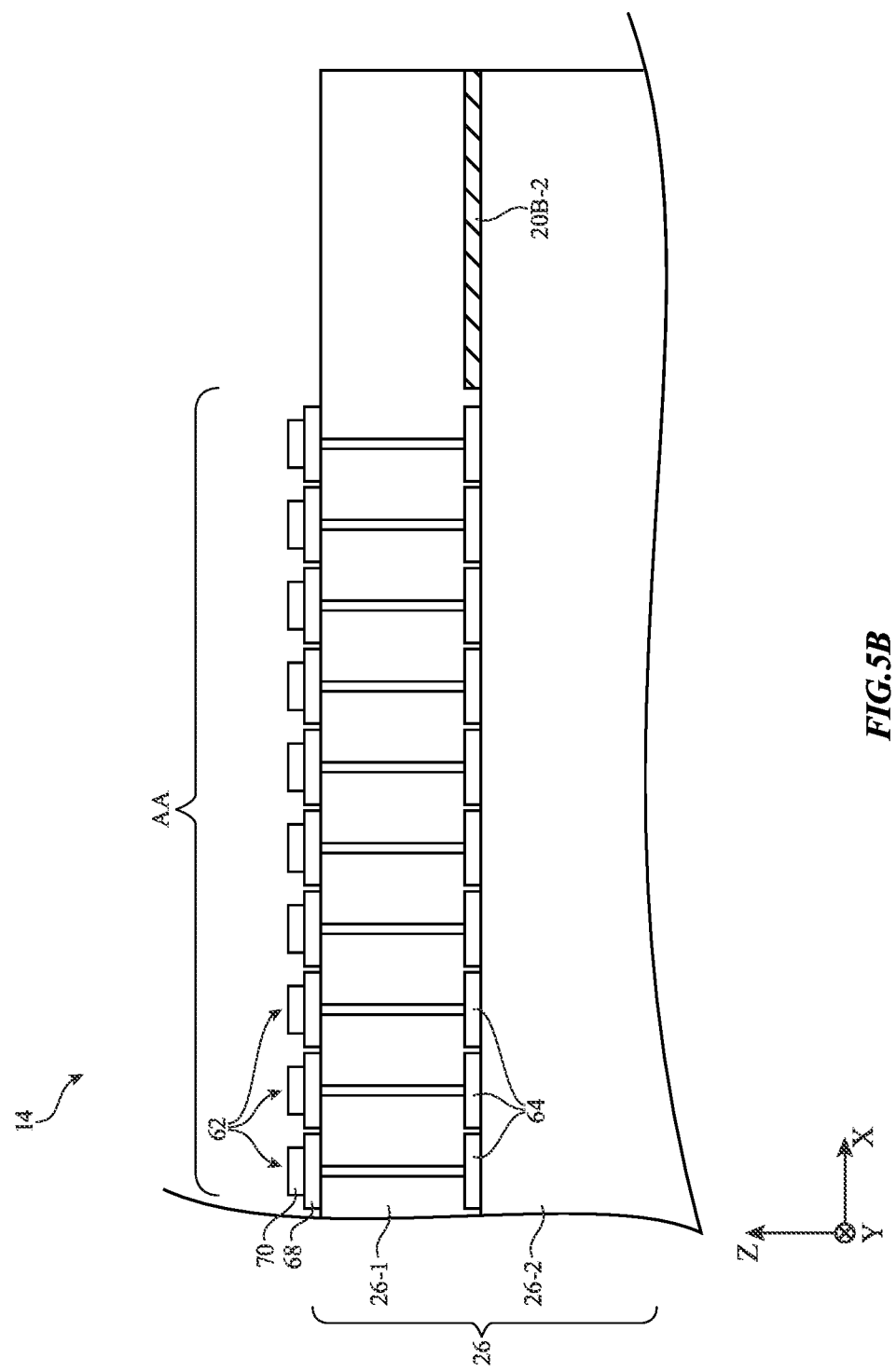
FIG. 5B is a cross-sectional side view of an illustrative display having emissive sub-pixels that overlap respective thin-film transistor sub-pixels in accordance with some embodiments.

FIG. 5B is a cross-sectional side view of the display shown in FIG. 5A. As shown in FIG. 5B, thin-film transistor sub-pixels 64 are formed within substrate 26. Substrate 26 may include one or more dielectric layers (such as layers 26-1 and 26-2) and metallization layers that form the thin-film transistor circuitry that operates the display. Thin-film transistor sub-pixels 64 are formed on dielectric layer 26-2. Each thin-film transistor sub-pixel is electrically connected to and controls a respective emissive sub-pixel 62. In the example of FIG. 5B, each emissive sub-pixel 62 includes a respective anode 68 and OLED layers 70 (e.g., a hole injection layer, hole transport layer, an emissive layer, a charge generation layer, an electron transport layer, an electron injection layer, etc.). This example is merely illustrative. In general, each emissive sub-pixel may be formed using any desired type of display technology (e.g., OLED, LED, LCD, etc.).

As shown in FIG. 5B, each emissive sub-pixel 62 vertically overlaps (e.g., in the Z-direction) a respective thin-film transistor sub-pixel 64 by which it is controlled. Outside the active area AA, gate driver circuitry 20B-2 is formed.

With the arrangement of FIGS. 5A and 5B, gate driver circuitry 20B is formed exclusively in the inactive area of the display (e.g., none of the gate driver circuitry is formed in the light-emitting active area).

In FIG. 5A, the display edge may be parallel to the X axis or the Y axis. The front face of the display may be parallel to the XY plane such that a user of the device views the front face of the display in the Z direction. In FIG. 5A, the sub-pixels are angled relative to the edges of the display (e.g., the edges of the sub-pixels are at non-zero, non-orthogonal angles relative to the X-axis and Y-axis). This example is merely illustrative. If desired, each individual subpixel may have edges parallel to the display edge.

Figure 6A:
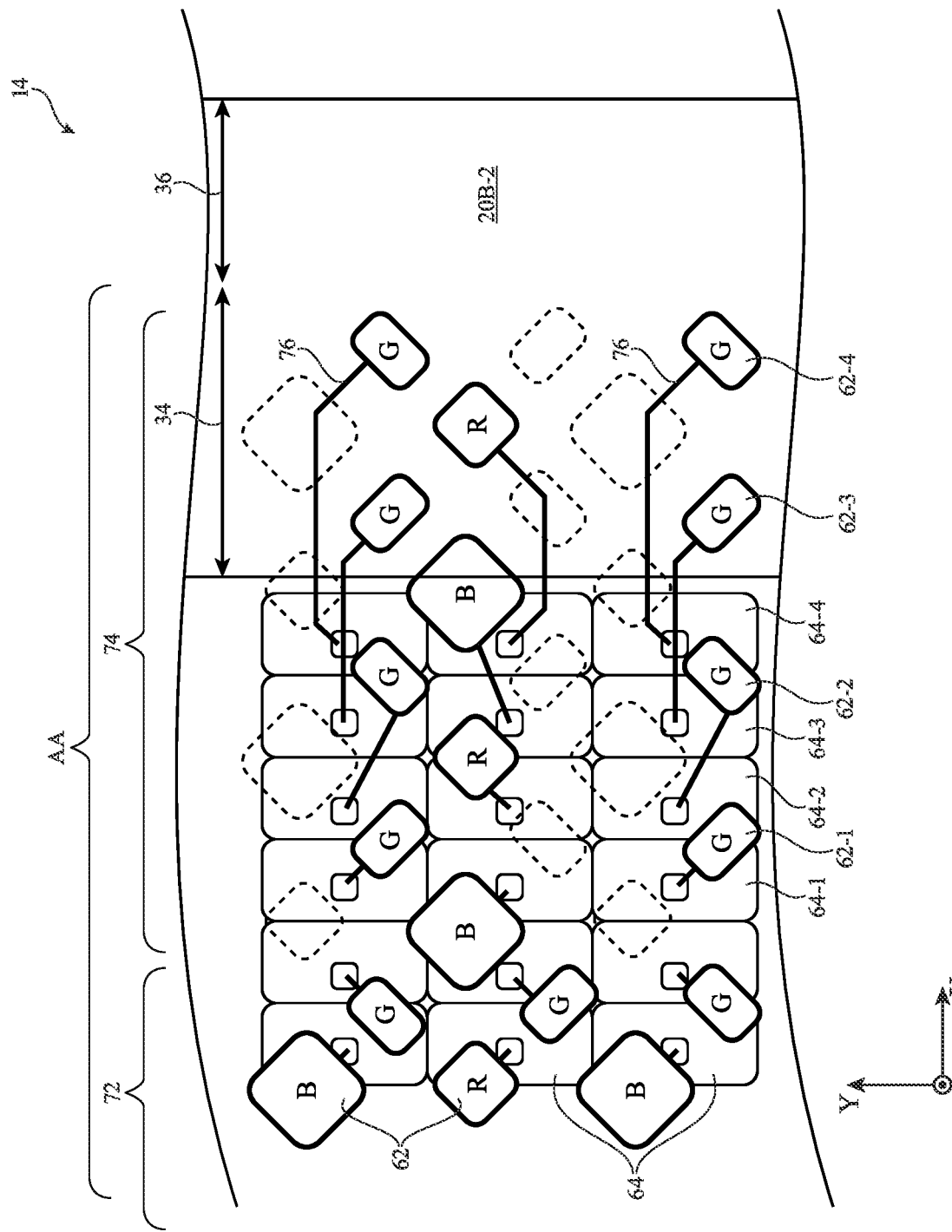
FIG. 6A is a top view of an illustrative display having a low pixel-density region with emissive sub-pixels that are shifted laterally relative to respective thin-film transistor sub-pixels in accordance with some embodiments.
Figure 6B:
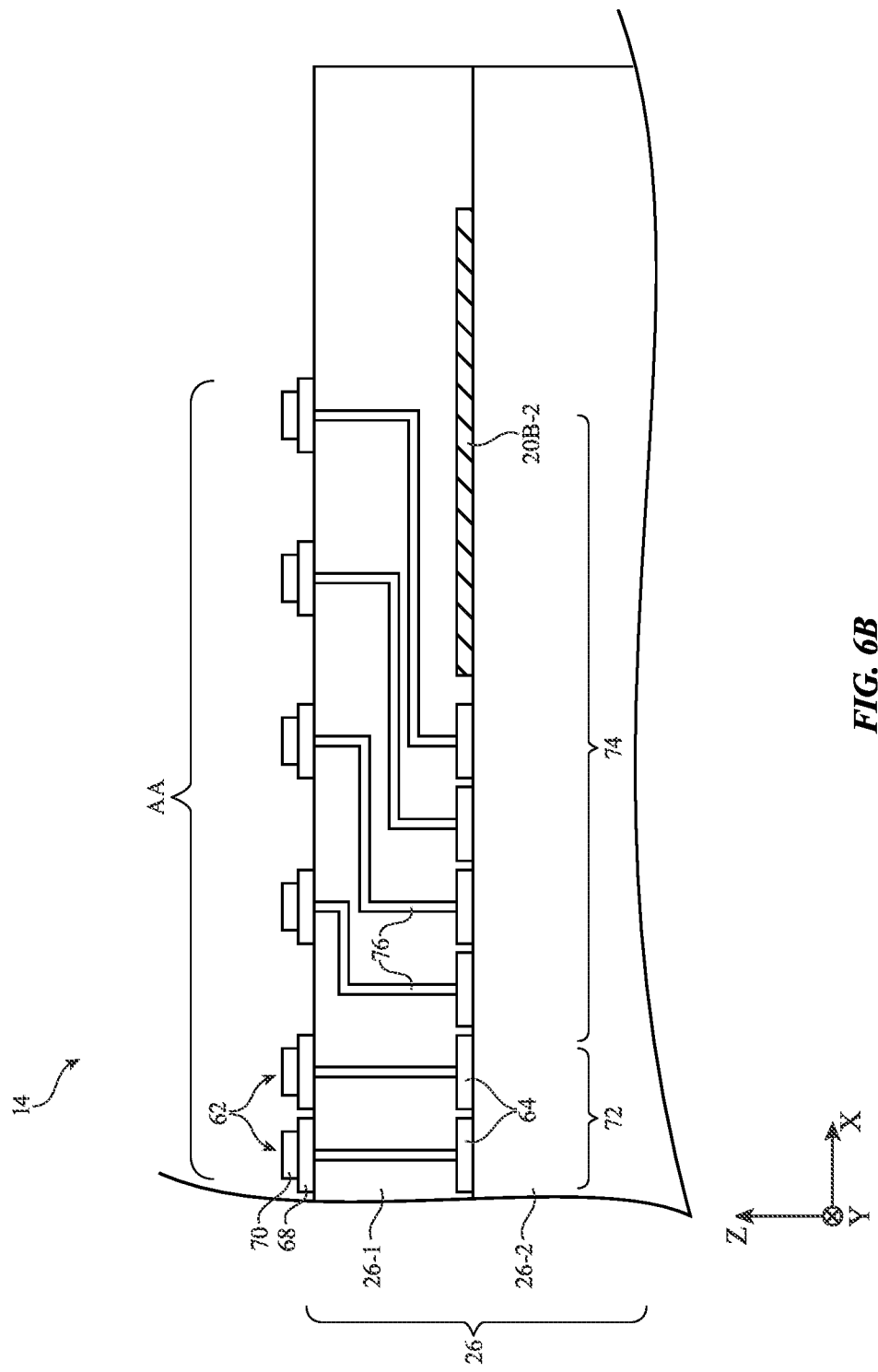
FIG. 6B is a cross-sectional side view of an illustrative display having a low pixel-density region with emissive sub-pixels that are shifted laterally relative to respective thin-film transistor sub-pixels in accordance with some embodiments.

FIGS. 6A and 6B show an arrangement that allows the gate driver circuitry to at least partially be formed in the light-emitting active area of the display. As shown in FIG. 6A, the active area includes a regular pixel-density region 72 and a low pixel-density region 74. In the regular pixel-density region 72 (sometimes referred to as high pixel-density region 72, normal pixel-density region 72, etc.), the emissive sub-pixels have an arrangement of the type shown in FIG. 5A. In the low pixel-density region 74, the emissive sub-pixels have a lower density (pixels per unit area) than in the normal pixel-density region. For example, there may be 50% the number of emissive sub-pixels in low pixel-density region 74 than in normal pixel-density region 72.

Because there are less emissive sub-pixels in low pixel-density region 74, less thin-film transistor sub-pixels are required in low pixel-density region 74 as well. In low pixel-density region 74 (as in normal pixel-density region 72), there may be one thin-film transistor sub-pixel for each emissive sub-pixel. Accordingly, if low pixel-density region 74 has 50% of the number of emissive sub-pixels than normal pixel-density region 72, low pixel-density region 74 also has 50% of the number of thin-film transistor sub-pixels than in normal pixel-density region 72.

This example is merely illustrative. In some cases, a single thin-film transistor sub-pixel in low pixel-density region 74 (and/or normal pixel-density region 72) drives two emissive sub-pixels. In one example, this type of arrangement is used in the low pixel-density region 74 but not normal pixel-density region 72. In this arrangement, low pixel-density region 74 has 50% of the number of emissive sub-pixels than normal pixel-density region 72 and low pixel-density region 74 has 25% of the number of thin-film transistor sub-pixels than in normal pixel-density region 72. In this arrangement, a single thin-film transistor sub-pixel may drive two emissive sub-pixels of the same color (e.g., two blue emissive sub-pixels, two red emissive sub-pixels, or two green emissive sub-pixels).

To accommodate gate driver circuitry 20B-2 underneath the active area, the thin-film transistor sub-pixels are grouped adjacent to normal pixel-density region 72. Consequently, the emissive sub-pixels in low pixel-density region 74 do not necessarily vertically overlap their respective thin-film transistor sub-pixels. As shown in FIG. 6A, each emissive sub-pixel may be electrically connected to its respective thin-film transistor sub-pixel by a respective conductive path 76. The conductive path may include one or more traces and one or more vias in the display substrate. The conductive path allows for the position of the emissive sub-pixel to be decoupled from the position of the thin-film transistor sub-pixel. This allows for the positions of the thin-film transistor sub-pixels and the positions of the emissive sub-pixels to be optimized independently, improving the performance of the display.

As examples, low pixel-density region 74 includes emissive sub-pixels 62-1, 62-2, 62-3, and 62-4. Emissive sub-pixel 62-1 is controlled by a thin-film transistor sub-pixel 64-1 that it vertically overlaps. However, emissive sub-pixel 62-2 is controlled by a thin-film transistor sub-pixel 64-2 that it does not vertically overlap. Emissive sub-pixel 62-2 is electrically connected to thin-film transistor sub-pixel 64-2 by a respective conductive path 76. Emissive sub-pixel 62-3 is controlled by a thin-film transistor sub-pixel 64-3 that it does not vertically overlap. Emissive sub-pixel 62-3 is electrically connected to thin-film transistor sub-pixel 64-3 by a respective conductive path 76. Emissive sub-pixel 62-4 is controlled by a thin-film transistor sub-pixel 64-4 that it does not vertically overlap. Emissive sub-pixel 62-4 is electrically connected to thin-film transistor sub-pixel 64-4 by a respective conductive path 76.

Reducing the number of emissive sub-pixels in region 74 and decoupling the position of the thin-film transistor sub-pixels and the emissive sub-pixels allows for gate driver circuitry 20B-2 to overlap region 74 of the active area AA. As shown in FIG. 6A, gate driver circuitry 20B-2 extends into active area AA by distance 34. An additional portion of the gate driver circuitry having width 36 is formed in the inactive area of the display.

FIG. 6B is a cross-sectional side view of the display shown in FIG. 6A. As shown in FIG. 6B, thin-film transistor sub-pixels 64 are formed within substrate 26. Substrate 26 may include one or more dielectric layers (such as layers 26-1 and 26-2) and metallization layers that form the thin-film transistor circuitry that operates the display. Thin-film transistor sub-pixels 64 are formed on dielectric layer 26-2. Each thin-film transistor sub-pixel 64 is electrically connected to and controls a respective emissive sub-pixel 62. In the example of FIG. 6B, each emissive sub-pixel 62 includes a respective anode 68 and OLED layers 70. This example is merely illustrative. In general, each emissive sub-pixel may be formed using any desired type of display technology (e.g., OLED, LED, LCD, etc.).

As shown in FIG. 6B, each emissive sub-pixel 62 in normal pixel-density region 72 vertically overlaps (e.g., in the Z-direction) a respective thin-film transistor sub-pixel 64 by which it is controlled. In low pixel-density region 74, however, conductive paths 76 allow for each emissive sub-pixel 62 to not necessarily vertically overlap the respective thin-film transistor sub-pixel 64 by which it is controlled. Some of the emissive sub-pixels are shifted laterally relative to their controlling thin-film transistor sub-pixel.

Each conductive path 76 may be formed from any desired metal layers within the display. Metal layers that are already present in the display for other functions may be patterned to include portions that help form the conductive paths. For example, a metal layer may be patterned to form gate lines, data lines, a pixel anode, a power supply line, and/or another desired display component in addition to forming at least a part of conductive path 76.

Grouping the thin-film transistor sub-pixels for low pixel-density region 74 adjacent to normal pixel-density region 72 (e.g., adjacent to the center of the pixel array) allows for space within the substrate to be vacated for additional components such as gate driver circuitry 20B-2 and/or data lines in a fanout region. As shown in FIG. 6B, gate driver circuitry 20B-2 is formed underneath some of the emissive sub-pixels in the low pixel-density region 74 of active area AA. Gate driver circuitry (such as circuitry 20B-1 or circuitry 20B-2 in FIG. 6B) may be formed using integrated circuits or thin-film transistor circuitry.

The example in FIG. 6B of gate driver circuitry 20B-2 being formed under emissive sub-pixels in the low pixel-density region is merely illustrative. Other electronic components (e.g., gate driver circuitry 20B-1, data lines for a fanout region, display driver circuitry 20A, etc.) may be formed under emissive sub-pixels in the low pixel-density region. Additionally, in FIG. 6B, the low pixel-density may extend along an edge of the active area (e.g., the right edge of the active area in FIG. 4). However, this example is merely illustrative. In general, any desired portion of the active area may have a low pixel-density in order to accommodate an additional component. For example, the left and/or right edge of the active area may have a low pixel-density region to accommodate gate driver circuitry, the lower-right and/or lower-left rounded corners of the active area may have a low pixel-density region to accommodate data lines in a fanout region, and/or the top and/or bottom edge of the active area may have a low pixel-density region to accommodate display driver circuitry (e.g., circuitry 20A in FIG. 4). As yet another example, a low pixel-density region may be positioned in a central portion of the active area such that the low pixel-density region is an island that is laterally surrounded by the normal pixel-density region for the display.

In addition or instead of selectively removing emissive sub-pixels in the low pixel-density region 74, the size and/or shape of emissive sub-pixels in region 74 (e.g., overlapping gate driver circuitry 20B-2) may be different than the size and/or shape of emissive sub-pixels in region 72 (e.g., not overlapping gate driver circuitry 20B-2). For example, the footprint of a red emissive sub-pixel in region 74 may be different (in size and/or shape) than the footprint of a red emissive sub-pixel in region 72, the footprint of a green emissive sub-pixel in region 74 may be different (in size and/or shape) than the footprint of a green emissive sub-pixel in region 72, and/or the footprint of a blue emissive sub-pixel in region 74 may be different (in size and/or shape) than the footprint of a blue emissive sub-pixel in region 72.

There are many optional patterns for omitting emissive sub-pixels in low pixel-density region 74. In FIG. 6A, continuous rows of emissive sub-pixels are omitted (note that the omitted sub-pixels are reflected by the dashed lines). In FIGS. 5A and 6A, the pixel array includes rows of green emissive sub-pixels and rows of alternating red and blue emissive sub-pixels. In FIG. 6A, every other row of green emissive sub-pixels is omitted in low pixel-density region 74. Similarly, every other row of alternating red and blue emissive sub-pixels is omitted in low pixel-density region 74.

The pattern of emissive pixel removal in FIG. 6A is merely illustrative. Different patterns of pixel removal may be used to minimize the detectability of the low pixel-density region to the viewer. Another example for a pixel removal pattern is shown in FIGS. 7 and 8.

To provide a uniform distribution of subpixels in the low pixel-density region, an intelligent pixel removal process may be implemented that systematically eliminates the closest subpixel of the same color (e.g., the nearest neighbor of the same color may be removed). FIG. 7 is a top layout view showing how subpixels can be systematically removed in accordance with an embodiment. As shown in FIG. 7, display 14 may be initially provided with an array of red (R), green (G), and blue (B) subpixels (e.g., as shown in FIG. 5A). The pixel removal process may involve, for each color, selecting a given subpixel, identifying the closest or nearest neighboring subpixels of the same color (in terms of distance from the selected subpixel), and then eliminating/omitting those identified subpixels in the final pixel removal region.

Figure 7:
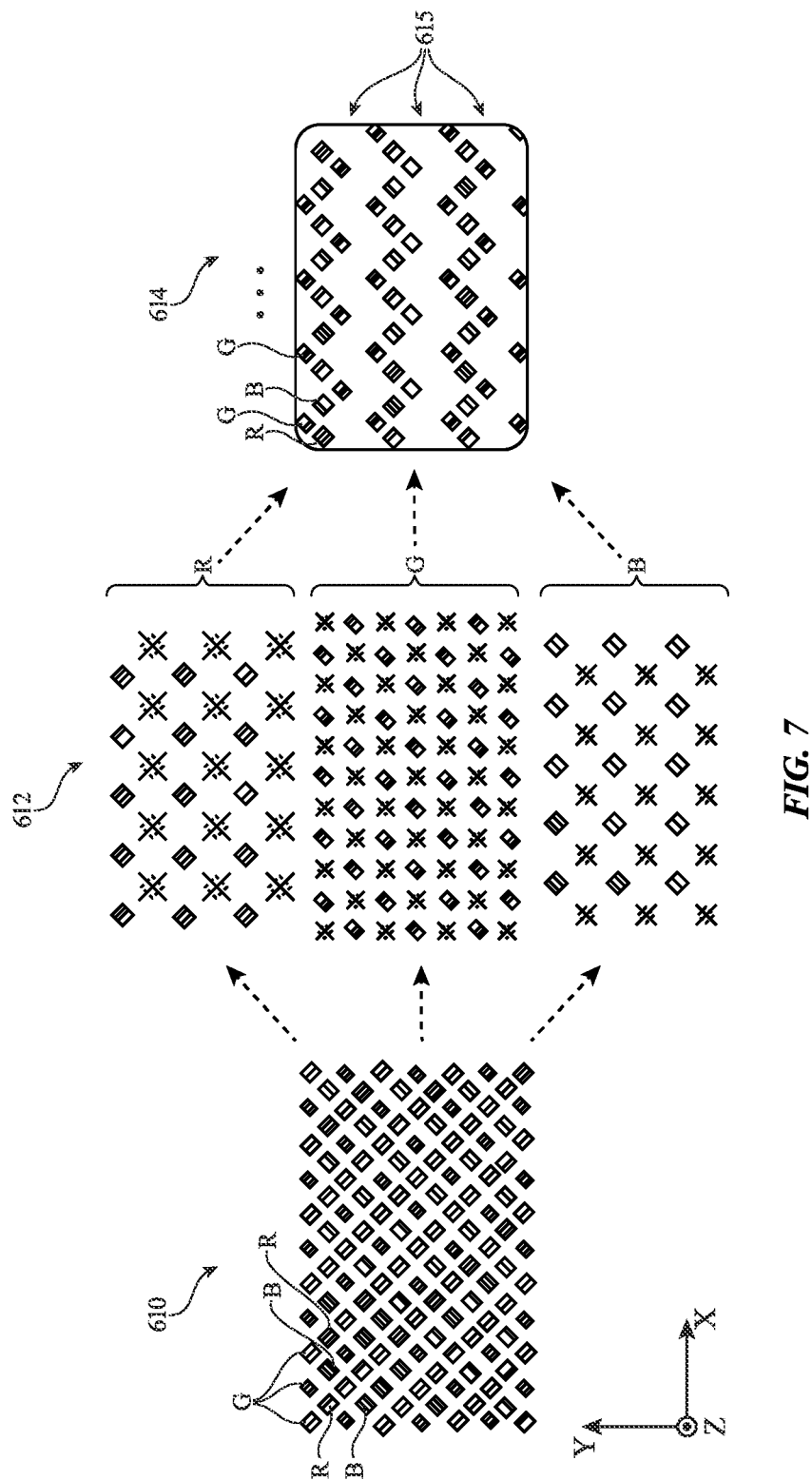
FIG. 7 is a top view showing an illustrative pixel removal scheme in accordance with some embodiments.
Figure 8:
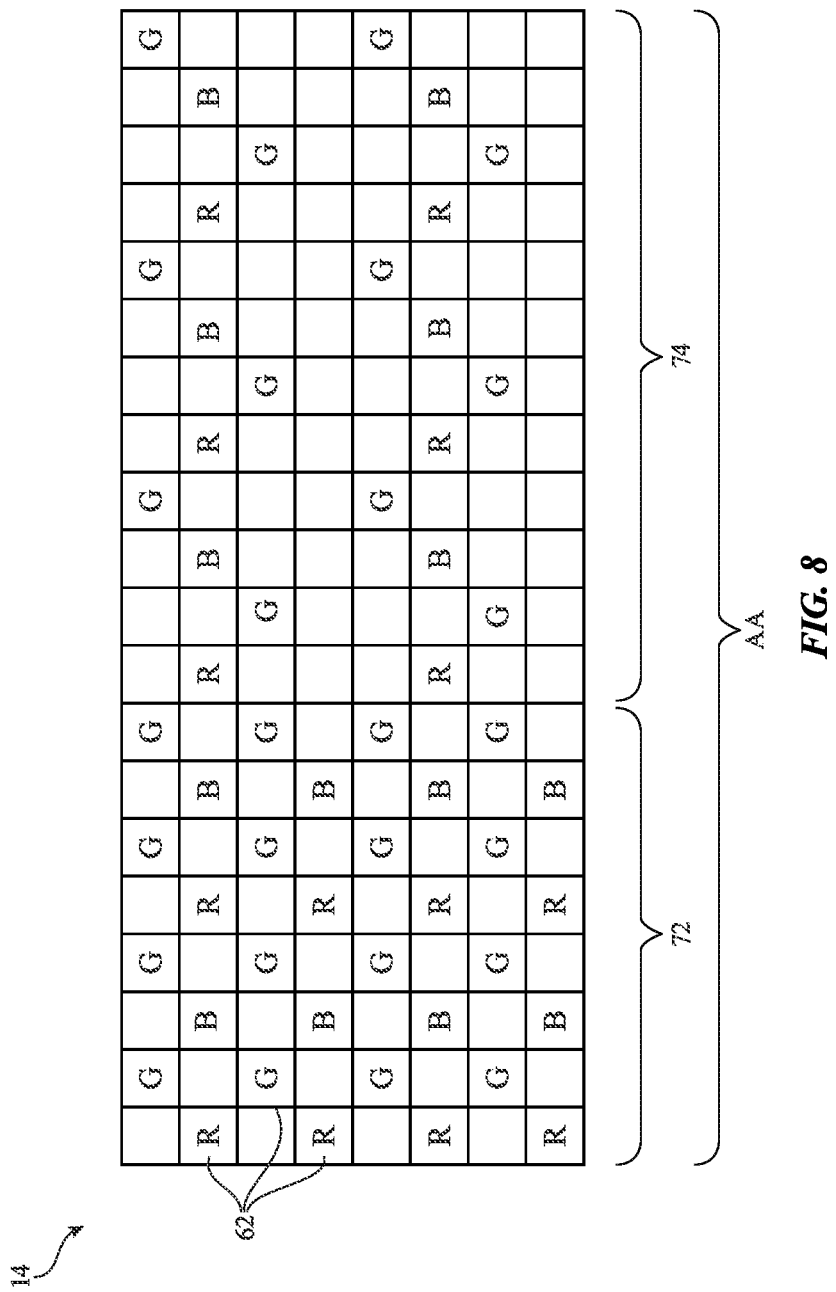
FIG. 8 is a top view of an illustrative display having a low pixel-density region with emissive sub-pixels that are shifted laterally relative to respective thin-film transistor sub-pixels and that are arranged according to the pixel removal pattern of FIG. 7 in accordance with some embodiments.

In FIG. 7, the display edge may be parallel to the X axis or the Y axis. The front face of the display may be parallel to the XY plane such that a user of the device views the front face of the display in the Z direction. Portion 610 of FIG. 7 shows the normal subpixel arrangement prior to removal. Portion 612 illustrates how every other subpixel may be removed for each color (the removed subpixels are marked using "X"). Portion 614 shows the resulting pixel configuration with 50% of the emissive sub-pixels removed. If desired, additional iterations of subpixel removal may be performed.

In the example of FIG. 7, the subpixels are removed such that there are horizontal stripes of empty pixel regions (see, e.g., continuous striping regions 615 devoid of subpixels in portion 614). This is merely illustrative. If desired, the subpixels may also be removed to create vertical stripes of empty pixel regions.

FIG. 8 is a top view of an illustrative pattern of emissive sub-pixels with a low pixel-density region that follows the pixel removal process of FIG. 7. In FIG. 8, red emissive sub-pixels are labeled with an R, green emissive sub-pixels are labeled with a G, and blue emissive sub-pixels are labeled with a B. As shown in FIG. 8, the low pixel-density region 74 includes 50% of the number of emissive sub-pixels as in normal pixel density region 72. The remaining emissive sub-pixels are arranged in zig-zag rows.

In FIG. 8, just as in FIGS. 6A and 6B, the thin-film transistor sub-pixels may be grouped adjacent to the normal pixel-density region 72 to allow space for gate driver circuitry (or other components) in the active area in low pixel-density region 74.

Because fewer emissive sub-pixels are present in low pixel-density region 74, the sub-pixels in this region may be driven at a higher brightness than the pixels in normal pixel density-region 72. A higher brightness in low pixel-density region 74 compensates for the reduced number of pixels and avoids a brightness disparity between normal pixel-density region 72 and low pixel-density region 74.

For example, consider an example where the display intends to show a solid white image. If the emissive sub-pixels in normal pixel-density region 72 and low pixel-density region 74 were operated at the same brightness levels, low pixel-density region 74 would have a lower perceived brightness than normal pixel-density region 72 (due to the reduced number of pixels). Therefore, the pixels in low pixel-density region 74 may emit light at a brightness that is approximately double the brightness of the pixels in normal pixel-density region 72 (to compensate for there being half of the pixels in low pixel-density region 74 than in normal pixel-density region 72). Operating the pixels in low pixel-density region 74 at double the brightness as the pixels in normal pixel-density region 72 may mitigate the brightness disparity between the two regions. However, the low pixel-density region 74 may still be visually distinguishable from the normal pixel-density region 72 when they are directly adjacent.

Figure 9:
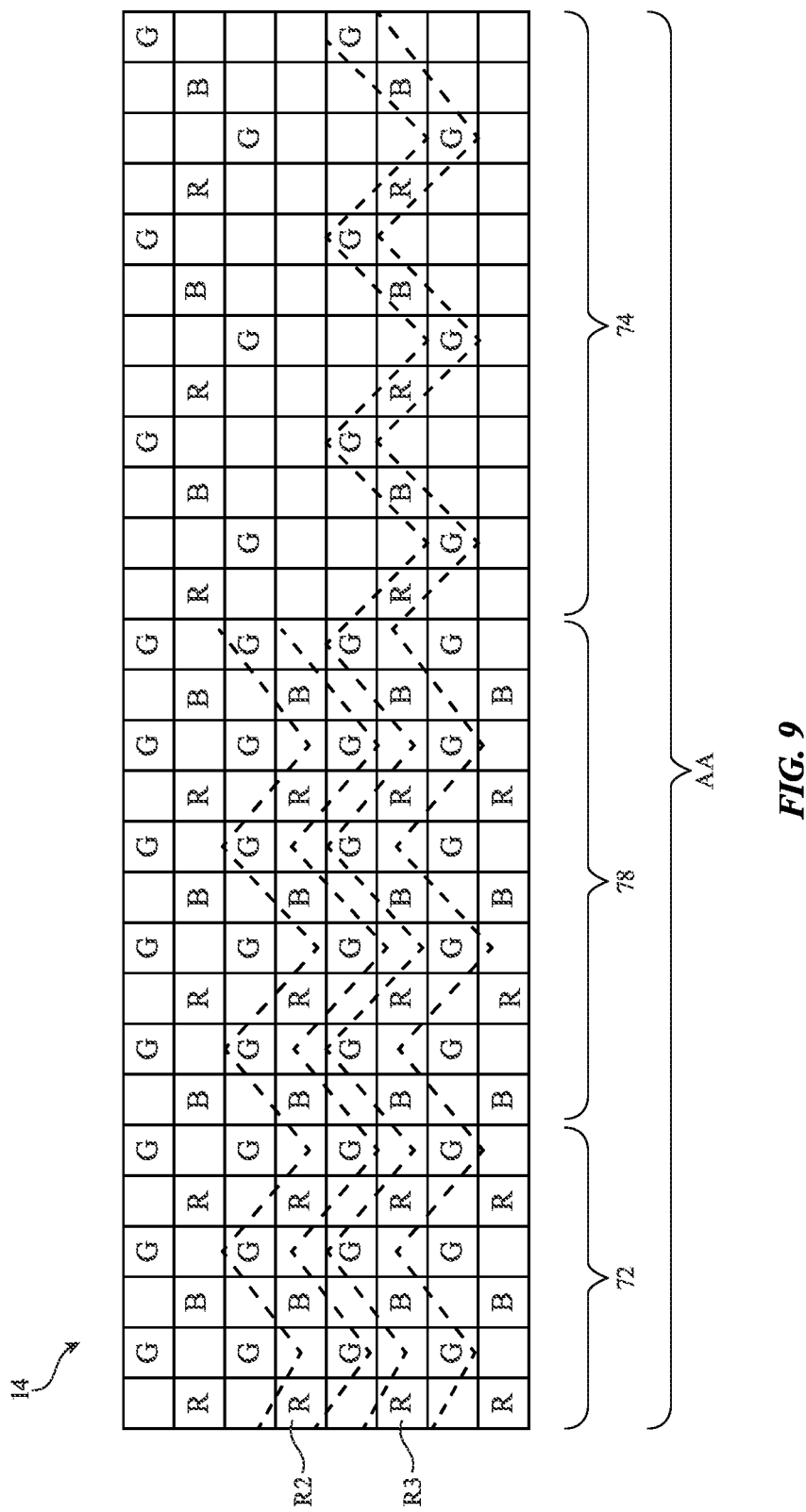
FIG. 9 is a top view of an illustrative display having a smoothing region between a normal pixel-density region and a low pixel-density region in accordance with some embodiments.

To prevent the low pixel-density region 74 from being detectable to the viewer, a smoothing region may be incorporated between low pixel-density region 74 and normal pixel-density region 72. FIG. 9 is a top view of an illustrative display showing a smoothing region 78 between low pixel-density region 74 and normal pixel-density region 72. Smoothing region 78 may also sometimes be referred to as transition region 78, buffer region 78, or brightness gradient region 78.

In normal pixel-density region 72, the emissive sub-pixels may operate at a nominal maximum brightness value x. In low pixel-density region 74, the emissive sub-pixels may operate at double the nominal maximum brightness value (2×). In smoothing region 78, the emissive sub-pixels may have a brightness gradient to smoothly transition between normal pixel-density region 72 and low pixel-density region 74.

In the example of FIG. 9, every other horizontal zig-zag row is present in low pixel-density region 74 whereas every other horizontal zig-zag row is omitted in low pixel-density region 74. For example, consider horizontal zig-zag row R2. This row is present in normal pixel-density region 72 and smoothing region 78 but omitted in low pixel-density region 74. Accordingly, in smoothing region 78, the brightness of the emissive sub-pixels may gradually decrease from the brightness×adjacent to normal pixel-density region 72 to a brightness of 0 (e.g., a zero brightness level, an off brightness level, etc.) adjacent to low pixel-density region 74.

Additionally, consider horizontal zig-zag row R3. This row is present in normal pixel-density region 72, smoothing region 78, and low pixel-density region 74. Accordingly, in smoothing region 78, the brightness of the emissive sub-pixels may gradually increase from the brightness×adjacent to normal pixel-density region 72 to a brightness of 2× adjacent to low pixel-density region 74.

In other words, the brightness in smoothing region 78 (which has a full pixel-density) is gradually changed to match the brightness pattern of low pixel-density region 74 (with some emissive sub-pixels having a higher brightness and some emissive sub-pixels omitted and therefore having zero brightness).

The example in FIG. 9 of using a brightness gradient in smoothing region 78 is merely illustrative. In another possible arrangement, the physical density (e.g., number per unit area) of the thin-film transistor sub-pixels and/or the emissive sub-pixels may be gradually changed in smoothing region 78.

Figure 10A:
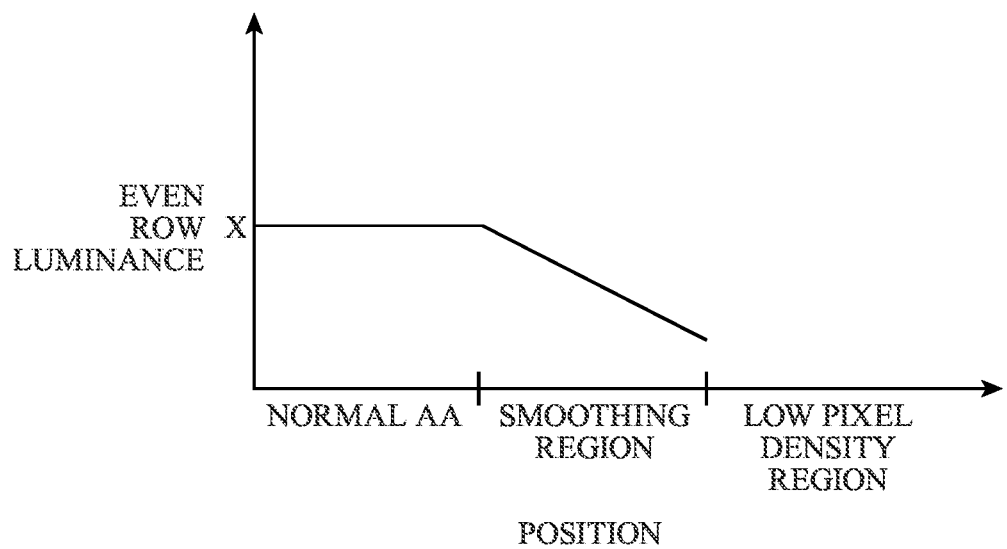
FIG. 10A is a graph of even row luminance as a function of position for the display of FIG. 9 in accordance with some embodiments.
Figure 10B:
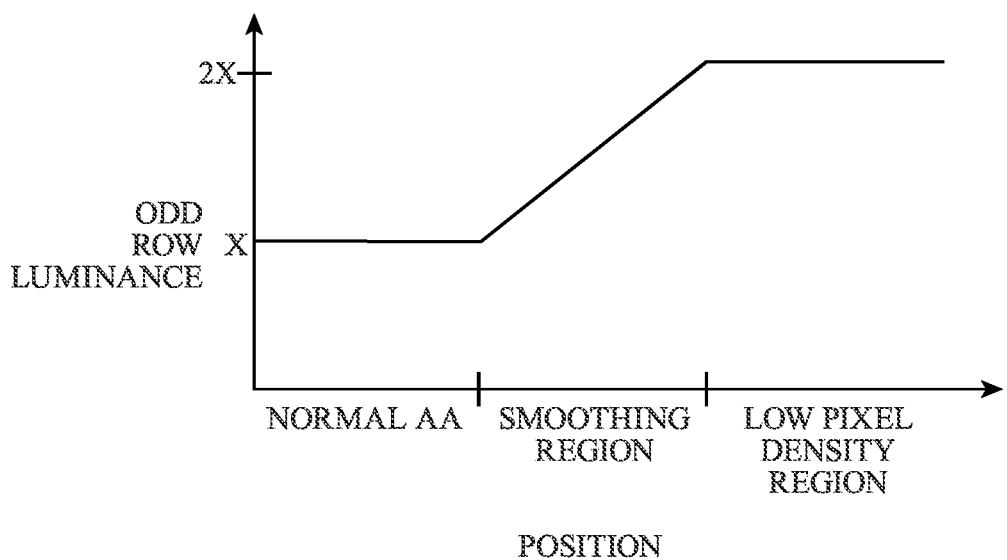
FIG. 10B is a graph of odd row luminance as a function of position for the display of FIG. 9 in accordance with some embodiments.

FIGS. 10A and 10B are graphs of luminance as a function of position within the active area of the display. In this example, the even rows (e.g., R2 in FIG. 9) are omitted in the low pixel-density region and the odd rows (e.g., R3 in FIG. 9) are included at double-brightness in the low pixel-density region.

FIG. 10A shows the even row luminance as a function of position across the display. As shown, in the normal active area (e.g., the normal pixel-density region), the pixels operate with a consistent brightness (e.g., maximum brightness) of x. In the low pixel-density region, the even rows are omitted (and therefore have a zero brightness). Accordingly, as shown in FIG. 10A, the brightness gradually decreases within the smoothing region from x (at the interface between the smoothing region and the normal pixel-density region) towards 0.

FIG. 10B shows the odd row luminance as a function of position across the display. As shown, in the normal active area (e.g., the normal pixel-density region), the pixels operate with a consistent brightness (e.g., maximum brightness) of x. In the low pixel-density region, the odd rows are operated consistently with a higher brightness (e.g., 2×). Accordingly, as shown in FIG. 10B, the brightness gradually increases within the smoothing region from x (at the interface between the smoothing region and the normal pixel-density region) to 2× (at the interface between the smoothing region and the low pixel-density region).

In the smoothing region, there may be at least one intermediate brightness value between the normal brightness value (x) and the low pixel-density region brightness value (2×), at least two intermediate brightness values, at least four intermediate brightness values, at least eight intermediate brightness values, etc. Similarly, there may be at least one intermediate brightness value between the normal brightness value (x) and the zero brightness value, at least two intermediate brightness values, at least four intermediate brightness values, at least eight intermediate brightness values, etc.

Figure 10C:
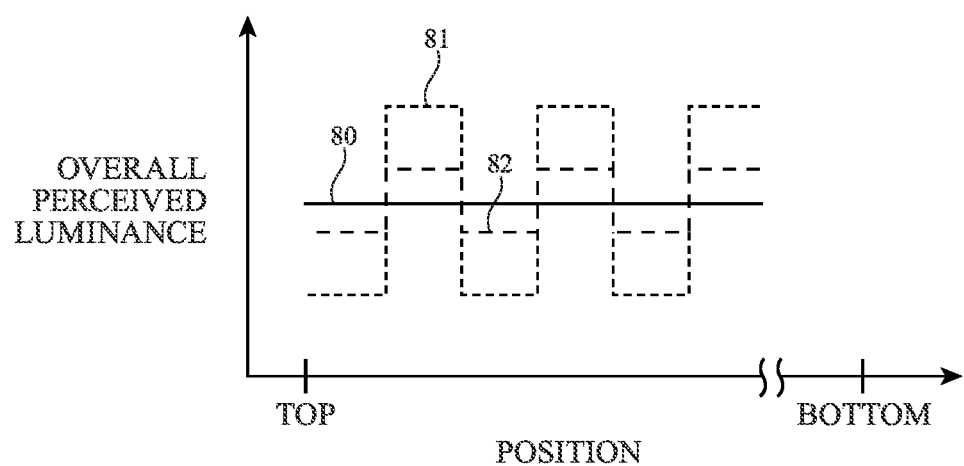
FIG. 10C is a graph of overall perceived luminance as a function of position for the display of FIG. 9 in accordance with some embodiments.

FIG. 10C is a graph showing the overall perceived luminance of the display as a function of position across the display. Specifically, profiles 80, 81, and 82 show the luminance of the display while moving from the top of the display (e.g., an upper edge) to the bottom of the display (e.g., a lower edge). Profile 80 shows the luminance across the display in a center of the display (e.g., in full pixel density region 72). In this case, the overall perceived luminance is constant when moving across the display. Profile 81 shows the luminance across the display at a left or right edge of the display (e.g., in low pixel density region 74) in an example where the smoothing region is omitted (and the normal active area directly borders the low pixel-density region). As shown, without the smoothing region, there are perceptible step changes in perceived luminance in the low pixel density region 74. These step changes are perceptible to the viewer, resulting in an undesired visible artifact on the display.

Profile 82 shows the luminance across the display at a left or right edge of the display (e.g., in low pixel density region 74) in an example where the smoothing region is included between the normal active area and the low pixel-density region. As shown, with the smoothing region, the perceived luminance has smaller step changes than in profile 81. The step changes are therefore less perceptible to the viewer.

In FIG. 9, smoothing region 78 includes 10 emissive sub-pixels in each row. This example is merely illustrative. In general, each row in smoothing region 78 may include at least one emissive sub-pixel, at least two emissive sub-pixels, at least four emissive sub-pixels, at least eight emissive sub-pixels, at least sixteen emissive sub-pixels, etc.

Figure 11:
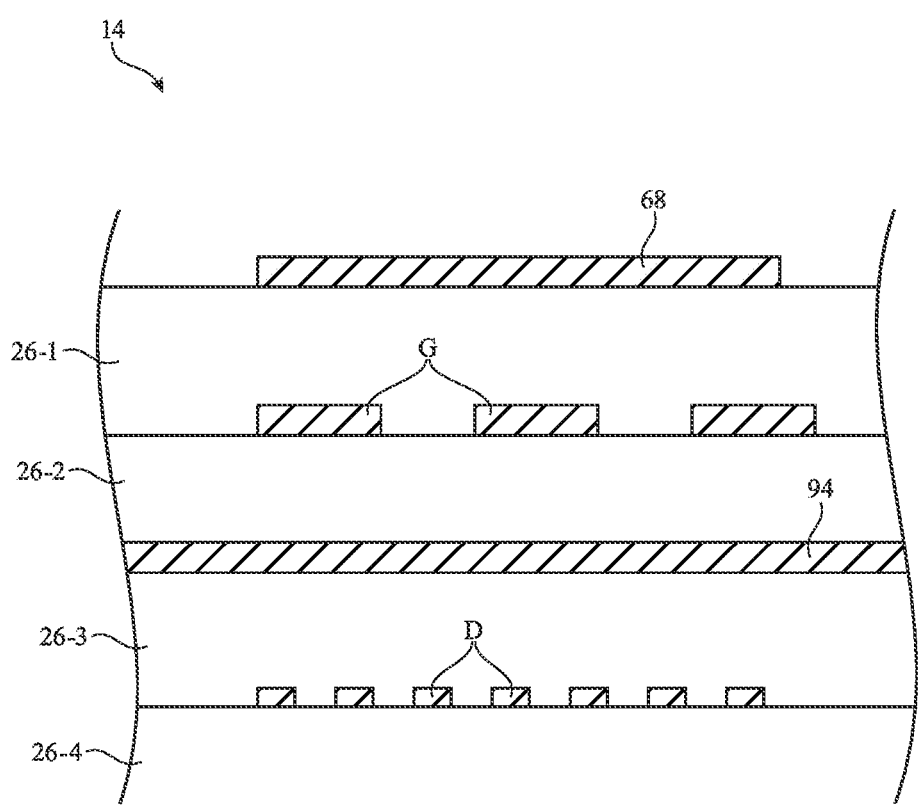
FIG. 11 is a cross-sectional side view of an illustrative display with a low pixel-density region and data lines in the active area in the low pixel-density region in accordance with some embodiments.

The example in FIG. 6B of gate driver circuitry 20B-2 being formed in the active area of the display is merely illustrative. If desired, data lines (e.g., in a fanout region) may be formed in the active area of the display. FIG. 11 is a cross-sectional side view of an illustrative display with data lines in an active area. As shown in FIG. 11, the display includes a plurality of dielectric layers 26-1, 26-2, 26-3, and 26-4. A pixel anode 68 (e.g., for an emissive sub-pixel) is formed on dielectric layer 26-1. Gate lines G are formed on dielectric layer 26-2 underneath the pixel anode 68. A power supply line 94 is formed on dielectric layer 26-3 underneath the pixel anode 68. Power supply line 94 provides a direct current for the display and may sometimes be referred to as DC power supply line 94. Finally, data lines D are formed in a fanout region on dielectric layer 26-4 underneath the pixel anode 68. Power supply line 94 may be coupled to display driver circuitry 20A and may provide a power supply voltage to the pixel array (e.g., a positive power supply voltage or a negative power supply voltage).

Data lines D may be formed underneath pixel anode 68 due to the presence of a low pixel-density region that vacates space for the data lines as discussed in connection with FIGS. 6A and 6B. The data lines may be fanout portions of the data lines in a fanout region (e.g., in a rounded corner of the active area). If care is not taken, capacitive coupling between anode 68 and data lines D may negatively impact display performance. However, with the arrangement of FIG. 11, power supply line 94 is interposed between anode 68 and data lines D and serves as a shield between anode 68 and data lines D. Therefore, data lines D do not capacitively couple to pixel anode 68 and there are no coupling artifacts during operation of the display. Gate lines G are also susceptible to capacitive coupling with pixel anode 68. However, this coupling does not negatively impact display performance.

The example (e.g., in FIGS. 6A and 6B) of reducing the density of pixels at the edge of the active area to accommodate gate driver circuitry 20B-2 underneath the active area is merely illustrative. In another possible arrangement, shown in FIG. 12, the density of the emissive sub-pixels is maintained across the display including at the edge(s) of the active area of the display.

Figure 12:
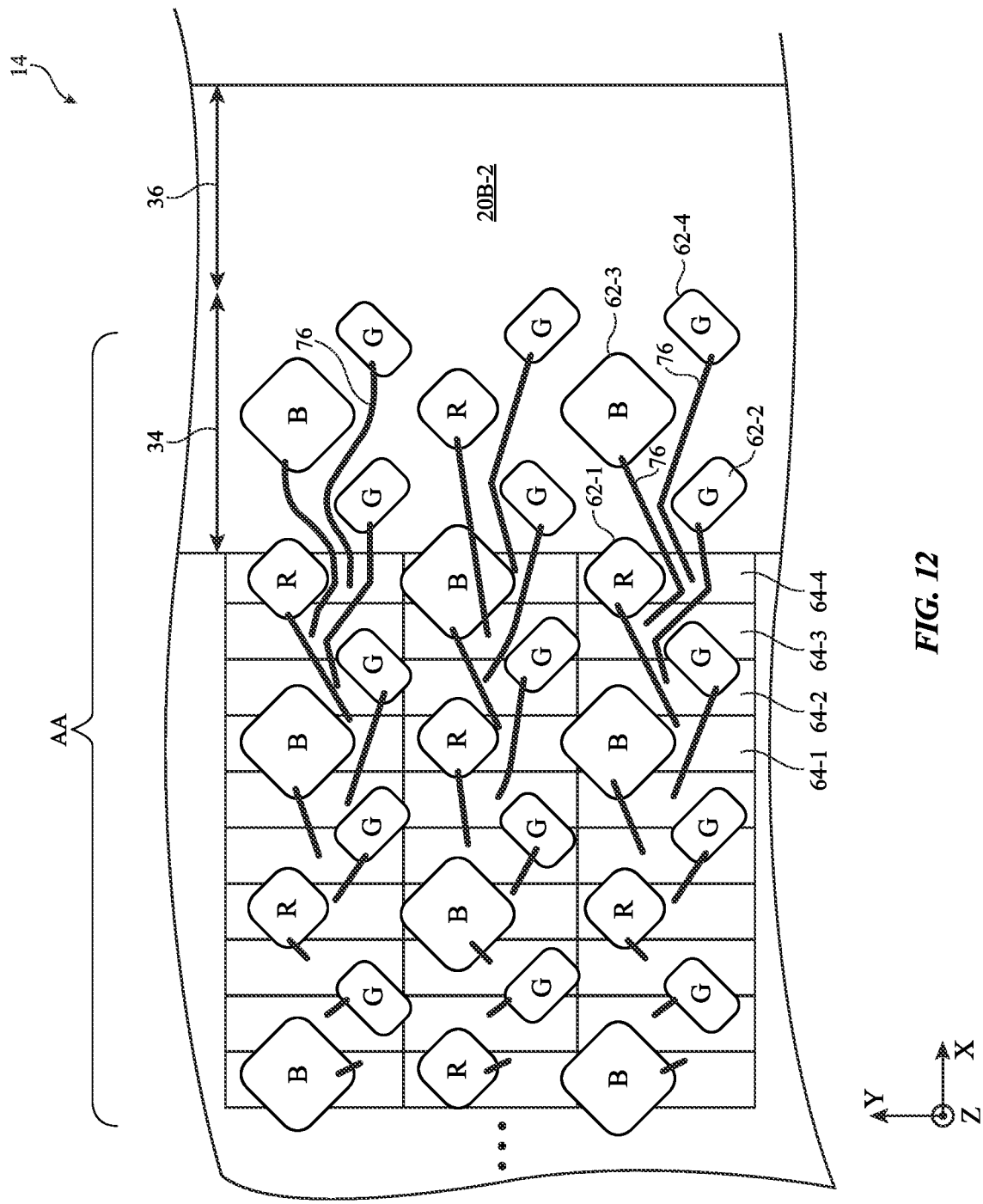
FIG. 12 is a top view of an illustrative display having emissive sub-pixels that are shifted laterally relative to respective thin-film transistor sub-pixels in accordance with some embodiments.

As shown in FIG. 12, the density of emissive sub-pixels is consistent across the active area AA. To accommodate a uniform emissive sub-pixel density across the display (while still having gate driver circuitry in the active area), the density of the thin-film transistor sub-pixels may be greater than the density of the emissive sub-pixels. The thin-film transistor sub-pixels therefore occupy a smaller footprint than the emissive sub-pixels. The thin-film transistor sub-pixels may be consolidated in a central portion of the active area, resulting in an area at the periphery of the active area where emissive sub-pixels can overlap gate driver circuitry.

The emissive sub-pixels in FIG. 12 may be arranged with a first density (e.g., number of emissive sub-pixels per unit area). The density of the emissive sub-pixels may be characterized by pixels per inch (PPI) or any other desired unit. The thin-film transistor sub-pixels in FIG. 12 may be arranged with a second density (e.g., number of thin-film transistor sub-pixels per unit area) that is greater than the first density (e.g., by at least 0.1%, by at least 0.5%, by at least 1%, by at least 2%, by at least 3%, by at least 5%, by at least 10%, etc.).

In the arrangement of FIG. 12, the emissive sub-pixels in active area AA do not necessarily vertically overlap their respective thin-film transistor sub-pixels. As shown in FIG. 12, each emissive sub-pixel may be electrically connected to its respective thin-film transistor sub-pixel by a respective conductive path 76. The conductive path may include one or more traces and one or more vias in the display substrate. The conductive path allows for the position of the emissive sub-pixel to be decoupled from the position of the thin-film transistor sub-pixel. This allows for the positions of the thin-film transistor sub-pixels and the positions of the emissive sub-pixels to be optimized independently, improving the performance of the display.

As examples, active area AA includes emissive sub-pixels 62-1, 62-2, 62-3, and 62-4. Emissive sub-pixel 62-1 is controlled by a thin-film transistor sub-pixel 64-1 that it does not vertically overlap. Emissive sub-pixel 62-1 is electrically connected to thin-film transistor sub-pixel 64-1 by a respective conductive path 76. Emissive sub-pixel 62-2 is controlled by a thin-film transistor sub-pixel 64-2 that it does not vertically overlap. Emissive sub-pixel 62-2 is electrically connected to thin-film transistor sub-pixel 64-2 by a respective conductive path 76. Emissive sub-pixel 62-3 is controlled by a thin-film transistor sub-pixel 64-3 that it does not vertically overlap. Emissive sub-pixel 62-3 is electrically connected to thin-film transistor sub-pixel 64-3 by a respective conductive path 76. Emissive sub-pixel 62-4 is controlled by a thin-film transistor sub-pixel 64-4 that it does not vertically overlap. Emissive sub-pixel 62-4 is electrically connected to thin-film transistor sub-pixel 64-4 by a respective conductive path 76.

Decoupling the position of the thin-film transistor sub-pixels and the emissive sub-pixels and increasing the density of the thin-film transistor sub-pixels relative to the emissive sub-pixels allows for gate driver circuitry 20B-2 to overlap the active area AA. As shown in FIG. 12, gate driver circuitry 20B-2 extends into active area AA by distance 34. An additional portion of the gate driver circuitry having width 36 is formed in the inactive area of the display.

Figure 13A:
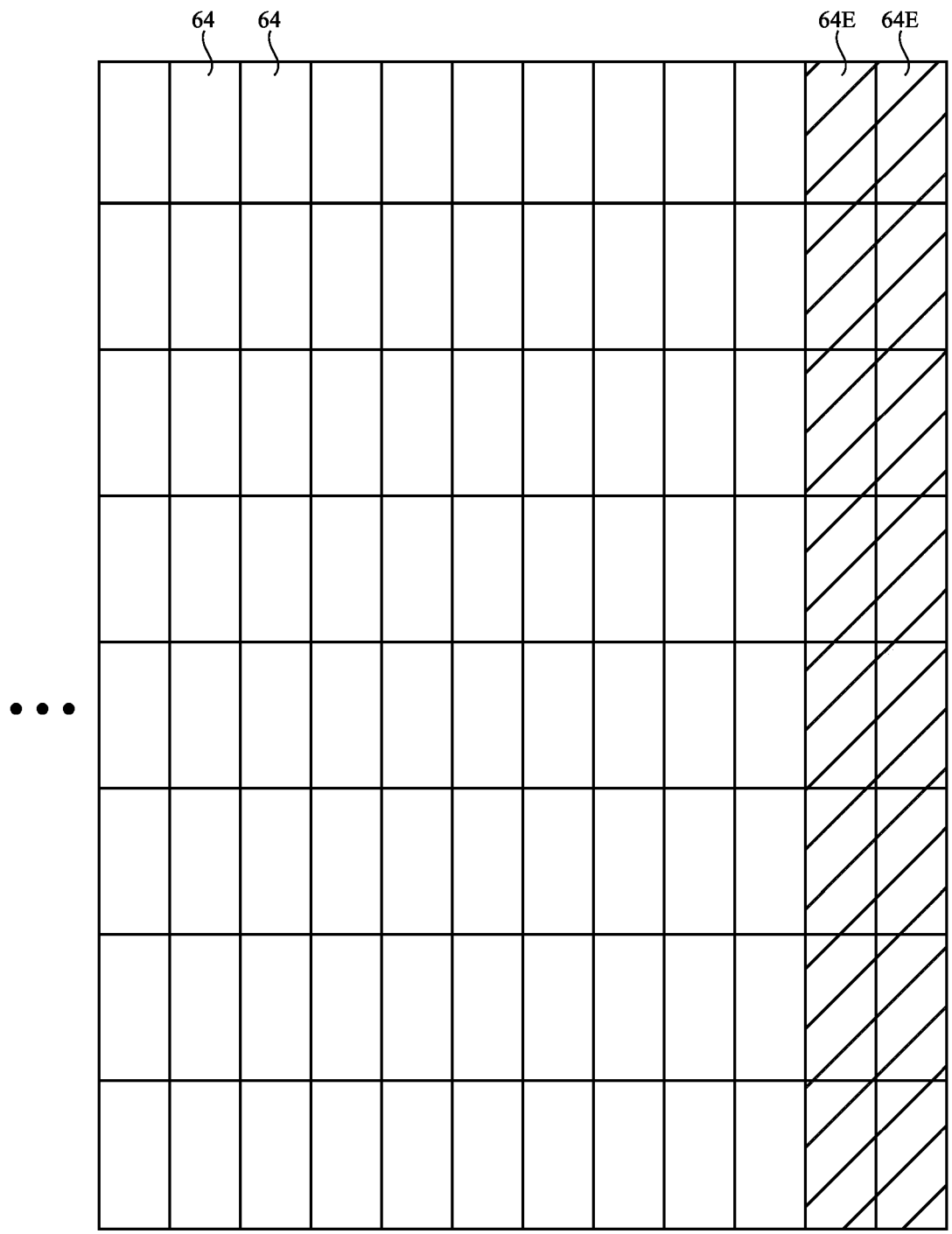
FIG. 13A is a top view of an array of thin-film transistor sub-pixels where the thin-film transistor sub-pixels that are used to drive emissive sub-pixels that overlap gate driver circuitry are grouped at the edge of the array in accordance with some embodiments.

FIG. 13A shows an arrangement for thin-film transistor sub-pixels in display 14. In the arrangement of FIG. 13A, thin-film transistor sub-pixels 64E that are used to drive emissive sub-pixels that overlap gate driver circuitry 20B-2 are grouped (consolidated) at the edge of the array of thin-film transistor sub-pixels. In other words, the edge-most thin-film transistor sub-pixels in the array of thin-film transistor sub-pixels are used to drive the edge-most emissive sub-pixels in the array of emissive sub-pixels. This example is merely illustrative.

Figure 13B:
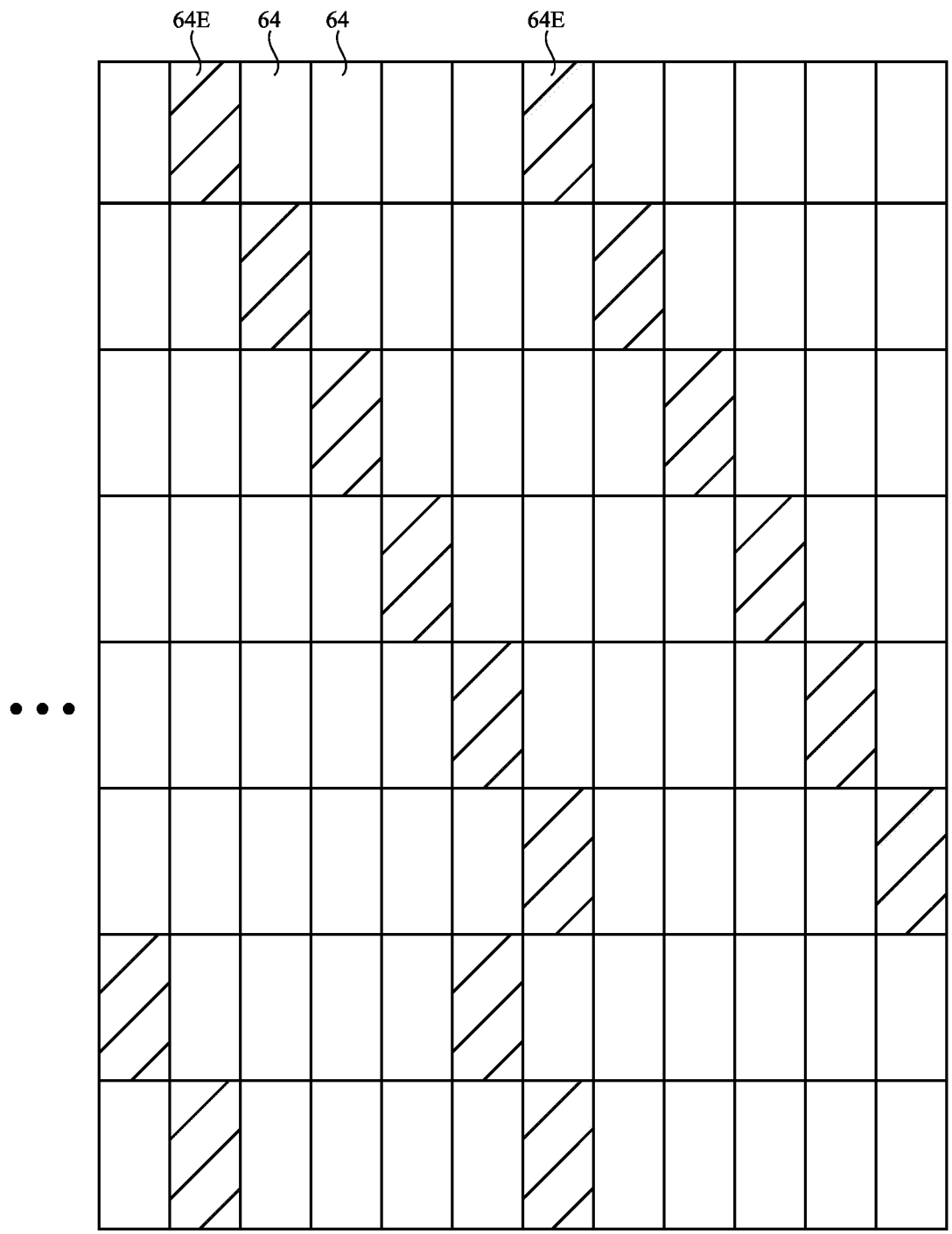
FIG. 13B is a top view of an array of thin-film transistor sub-pixels where the thin-film transistor sub-pixels that are used to drive emissive sub-pixels that overlap gate driver circuitry are distributed across the array in accordance with some embodiments.

In another possible arrangement, shown in FIG. 13B, thin-film transistor sub-pixels 64E that are used to drive emissive sub-pixels that overlap gate driver circuitry 20B-2 are distributed throughout the array of thin-film transistor sub-pixels. In other words, central (non-edge-most) thin-film transistor sub-pixels in the array of thin-film transistor sub-pixels may be used to drive the edge-most emissive sub-pixels in the array of emissive sub-pixels if desired.

In general, thin-film transistor sub-pixels 64E that are used to drive emissive sub-pixels that overlap gate driver circuitry 20B-2 may be grouped at the edge of the array of thin-film transistor sub-pixels (as in FIG. 13A), grouped at a non-edge portion of the array of thin-film transistor sub-pixels, evenly distributed throughout the array of thin-film transistor sub-pixels, unevenly distributed throughout the array of thin-film transistor sub-pixels, randomly distributed throughout the array of thin-film transistor sub-pixels, etc. There may be at least one thin-film transistor sub-pixel 64 that does not control an emissive sub-pixel that overlaps gate driver circuitry 20B-2 interposed between a thin-film transistor sub-pixel 64E that drives an emissive sub-pixel that overlaps gate driver circuitry 20B-2 and the edge of the array of thin-film transistor sub-pixels (as in the example of FIG. 13B, for example).

FIGS. 13A and 13B depict an example where the array of thin-film transistor sub-pixels has a uniform density across the display. This example is merely illustrative. In another possible arrangement, the array of thin-film transistor sub-pixels may have a non-uniform density. The array of thin-film transistor sub-pixels may include a first portion with a first density and a second portion with a second density that is greater than the first density (e.g., by at least 0.1%, by at least 0.5%, by at least 1%, by at least 2%, by at least 3%, by at least 5%, by at least 10%, etc.). One or both of the first and second portions of the array of thin-film transistor sub-pixels may have a higher density than the density of the emissive sub-pixels (e.g., by at least 0.1%, by at least 0.5%, by at least 1%, by at least 2%, by at least 3%, by at least 5%, by at least 10%, etc.).

Figure 14:
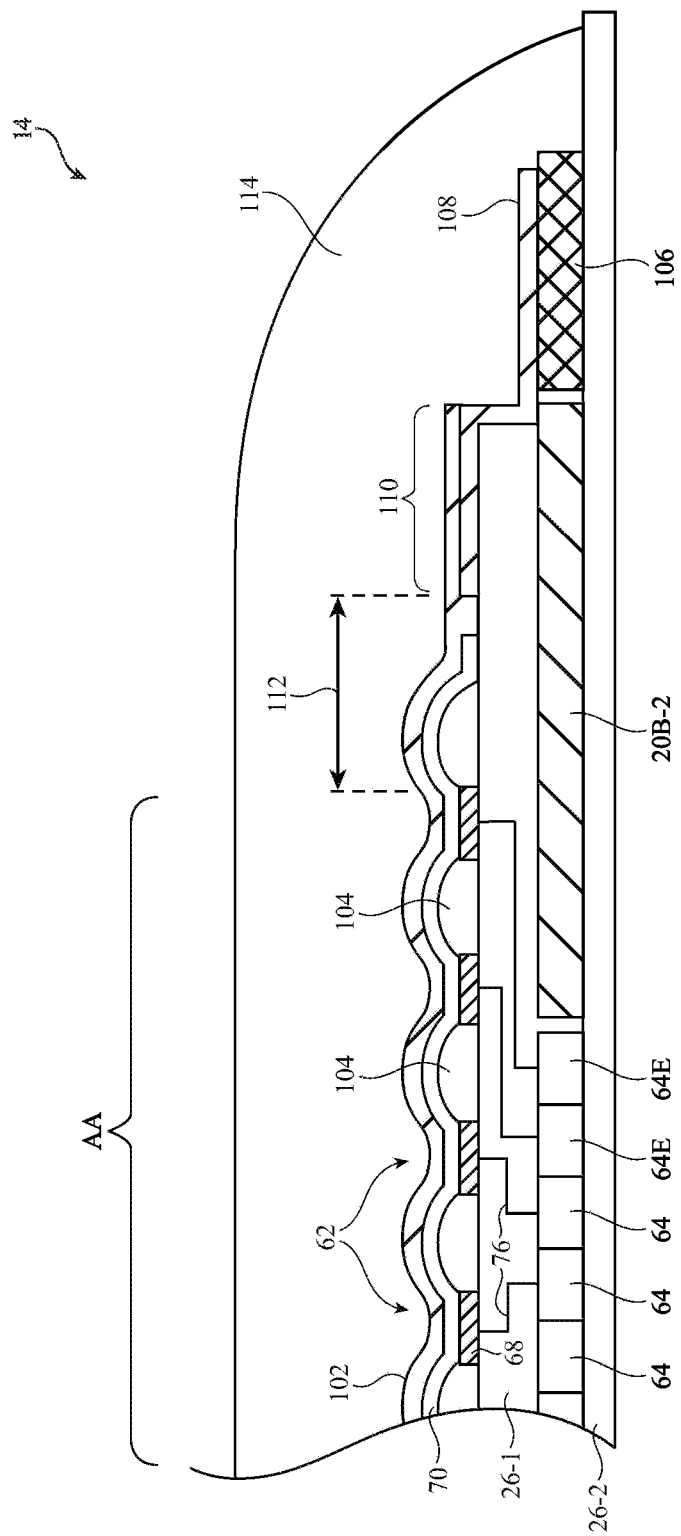
FIG. 14 is a cross-sectional side view of an illustrative display having emissive sub-pixels that are shifted laterally relative to respective thin-film transistor sub-pixels in accordance with some embodiments.

FIG. 14 is a cross-sectional side view of the display shown in FIG. 12. As shown in FIG. 14, thin-film transistor sub-pixels 64 are formed within substrate 26. Substrate 26 may include one or more dielectric layers (such as layers 26-1 and 26-2) and metallization layers that form the thin-film transistor circuitry that operates the display. Layers 26-1 and 26-2 may sometimes be referred to as substrate layers 26-1 and 26-2, respectively. Layer 26-2 may be formed from polyimide in one example.

Thin-film transistor sub-pixels 64 are formed on dielectric layer 26-2. Each thin-film transistor sub-pixel 64 is electrically connected to and controls a respective emissive sub-pixel 62. In the example of FIG. 14, each emissive sub-pixel 62 includes a respective anode 68 and OLED layers 70. The emissive sub-pixels 62 also share a common cathode 102. The common cathode may be formed from a transparent conductive material (e.g., indium tin oxide). A pixel definition layer 104 may be formed between adjacent anodes 68 and define apertures through which the emissive sub-pixels emit light.

This example in FIG. 14 of display 14 being an OLED display is merely illustrative. In general, each emissive sub-pixel may be formed using any desired type of display technology (e.g., OLED, LED, LCD, etc.).

As shown in FIG. 14, conductive paths 76 allow for each emissive sub-pixel 62 to not necessarily vertically overlap the respective thin-film transistor sub-pixel 64 by which it is controlled. Some of the emissive sub-pixels are shifted laterally relative to their controlling thin-film transistor sub-pixel. Emissive sub-pixels may be shifted laterally relative to their controlling thin-film transistor sub-pixel either away from a center of the active area or towards the center of the active area.

Each conductive path 76 may be formed from any desired metal layers within the display. Metal layers that are already present in the display for other functions may be patterned to include portions that help form the conductive paths. For example, a metal layer may be patterned to form gate lines, data lines, a pixel anode, a power supply line, and/or another desired display component in addition to forming at least a part of conductive path 76.

Decoupling the position of the thin-film transistor sub-pixels and the emissive sub-pixels and increasing the density of the thin-film transistor sub-pixels relative to the emissive sub-pixels allows for space within the substrate to be vacated for additional components such as gate driver circuitry 20B-2 and/or data lines in a fanout region. As shown in FIG. 14, gate driver circuitry 20B-2 is formed underneath some of the emissive sub-pixels in the active area AA. Gate driver circuitry (such as circuitry 20B-1 or circuitry 20B-2 in FIG. 14) may be formed using integrated circuits or thin-film transistor circuitry.

The example in FIG. 14 of gate driver circuitry 20B-2 being formed under emissive sub-pixels in the active area is merely illustrative. Other electronic components (e.g., gate driver circuitry 20B-1, data lines for a fanout region, display driver circuitry 20A, etc.) may be formed under emissive sub-pixels in the active area. In general, any desired portion of the active area may accommodate an additional component. For example, the left and/or right edge of the active area may accommodate gate driver circuitry, the lower-right and/or lower-left rounded corners of the active area may accommodate data lines in a fanout region, and/or the top and/or bottom edge of the active area may accommodate display driver circuitry (e.g., circuitry 20A in FIG. 4). As yet another example, a central portion of the active area may be arranged to accommodate additional components on substrate 26.

Display 14 may include a power supply line 106 that provides a power supply voltage (ELVSS) to cathode 102. A routing layer 108 (sometimes referred to as a conductive routing layer 108, conductive layer 108, etc.) may electrically connect power supply line 106 to cathode 102. Routing layer 108 may be formed from any desired conductive material. As shown in FIG. 14, routing layer 108 and cathode 102 overlap in region 110. Region 110 may need to have a sufficient area to ensure proper contact between layer 108 and cathode 102. One or more layers of encapsulant 114 (including organic and/or inorganic dielectric layers) may cover cathode 102 and the remaining display components on substrate 26.

In FIG. 14, cathode layer 102 is formed as a blanket layer across the entire display. In other words, the cathode layer is a common cathode layer that maintains continuity across the active area. OLED layers 70 for emissive sub-pixels 62 may also be formed as blanket layers across the display. To mitigate lateral leakage between adjacent emissive sub-pixels, the pixel definition layer 104 may optionally be shaped to create discontinuities in OLED layers 70 between adjacent emissive sub-pixels (or another structure may be included in the display to create discontinuities in OLED layers 70 between adjacent emissive sub-pixels).

Deposition techniques for OLED layers 70 may result in the OLED layers extending a minimum distance out of the active area and into the inactive area. This buffer required for OLED layers 70 may impact the size of the inactive border region around active area AA in display 14. As shown in FIG. 14, there is a distance 112 between the edge of the active area (e.g., at the outermost edge of the outermost anode) and cathode contact area 110. Distance 112 may be required to be sufficiently large to accommodate the buffer required for OLED layers 70. Distance 112 may be reduced by reducing the buffer required for OLED layers 70. The buffer required for OLED layers 70 may be reduced by using tighter mask margins for the blanket deposition of the OLED layers or by using a non-final-metal-mask (non-FMM) patterning technique where the OLED layers are directly patterned. In one illustrative arrangement distance 112 may be less than 150 microns, less than 100 microns, less than 75 microns, less than 50 microns, greater than 50 microns, etc.

Other factors that impact the size of the inactive border region around active area AA in display 14 are the width of the contact area 110 between cathode 102 and routing layer 108 (to provide cathode 102 with the power supply voltage) as well as the width of power supply line 106 itself.

Figure 15:
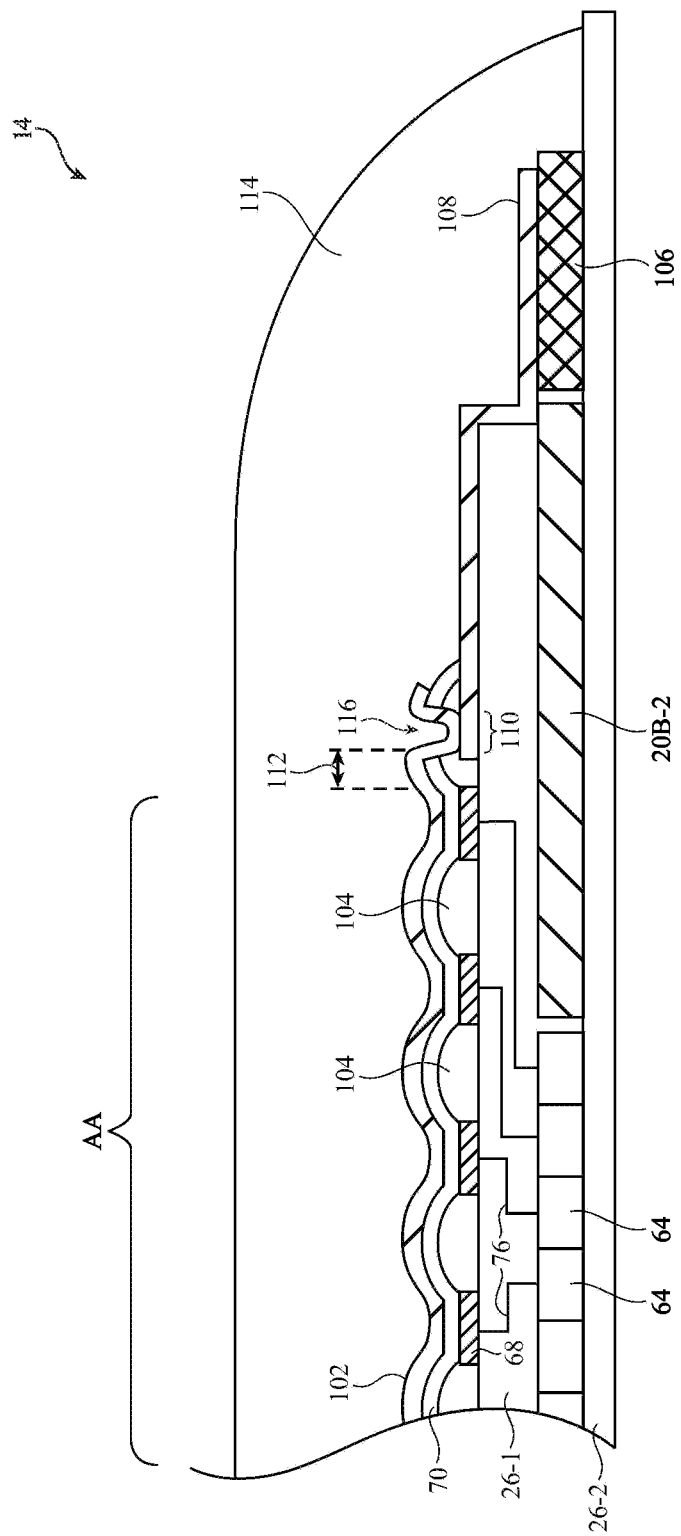
FIG. 15 is a cross-sectional side view of an illustrative display having a via for a cathode contact region in accordance with some embodiments.

In FIG. 14, cathode 102 does not contact routing layer 108 until after the OLED buffer is complete. In other words, cathode 102 cannot contact routing layer 108 through the OLED layer 70 so the contact region does not begin until the OLED layer ends. One way to reduce the size of the inactive border area of the display is to instead create a via through the OLED layers in the inactive area. FIG. 15 is a cross-sectional side view of a display of this type.

As shown in FIG. 15, a via 116 is created through pixel definition layer 104 and OLED layers 70 in the inactive area of the display. The via may be created after deposition of the pixel definition layer 104 and OLED layers 70 (e.g., using a laser via drilling process). After the via is created, cathode 102 may be deposited. Cathode 102 may fill via 116 and contact conductive routing layer 108 through via 116. In this way, the distance 112 between the edge of the active area and the start of the cathode contact region 110 is reduced in FIG. 15 relative to FIG. 14. Distance 112 in FIG. 15 may be less than 100 microns, less than 75 microns, less than 50 microns, less than 30 microns, less than 20 microns, greater than 10 microns, etc.

Figure 16:
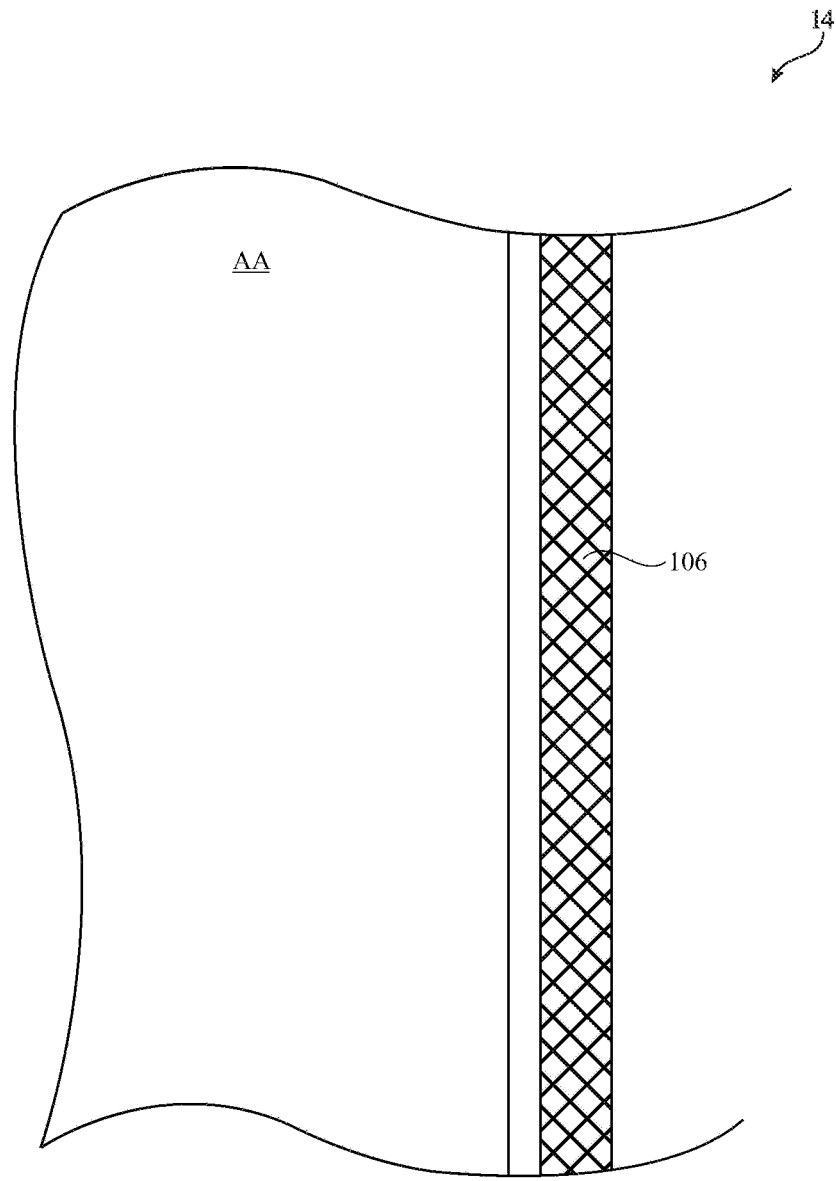
FIG. 16 is a top view of an illustrative display having a power supply line in an inactive border region of the display in accordance with some embodiments.

Another technique to mitigate the width of the inactive border region of the display is to remove power supply line 106 from the inactive border region of the display. In FIGS. 14 and 15, power supply line 106 is formed in the inactive border region of the display along an edge of the display, as shown in the top view of FIG. 16. The width of the power supply line therefore contributes to the width of the inactive border region of the display.

Figure 17:
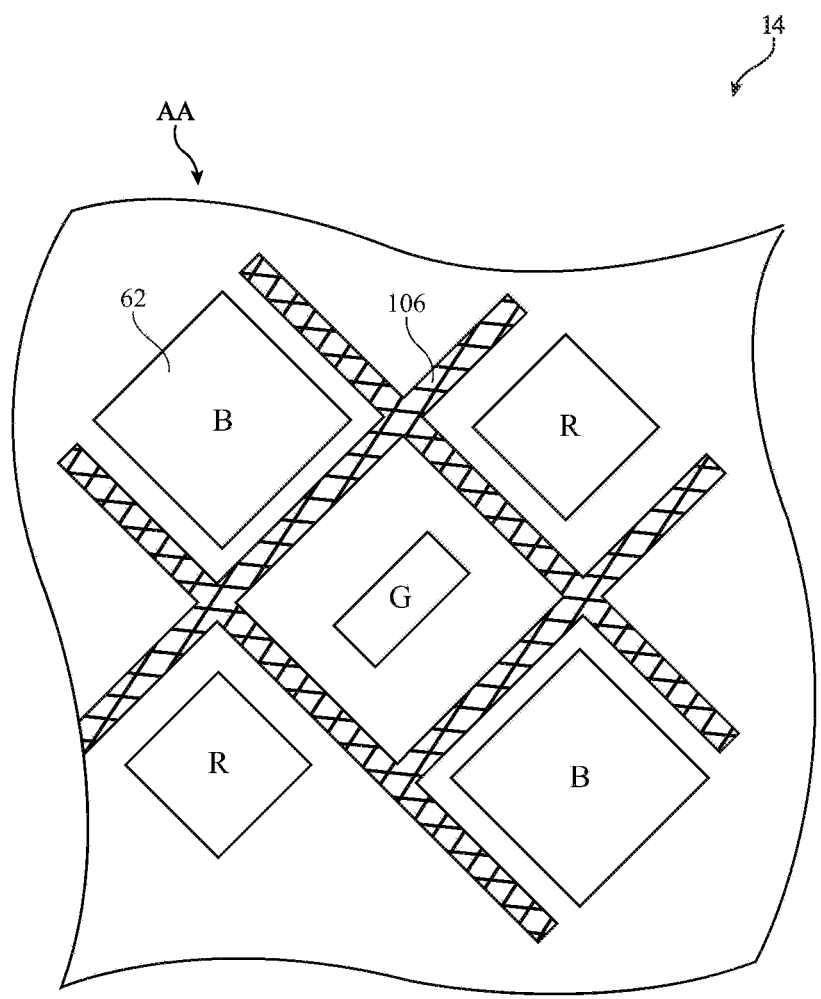
FIG. 17 is a top view of an illustrative display having a power supply line in an active area of the display in accordance with some embodiments.
Figure 18:
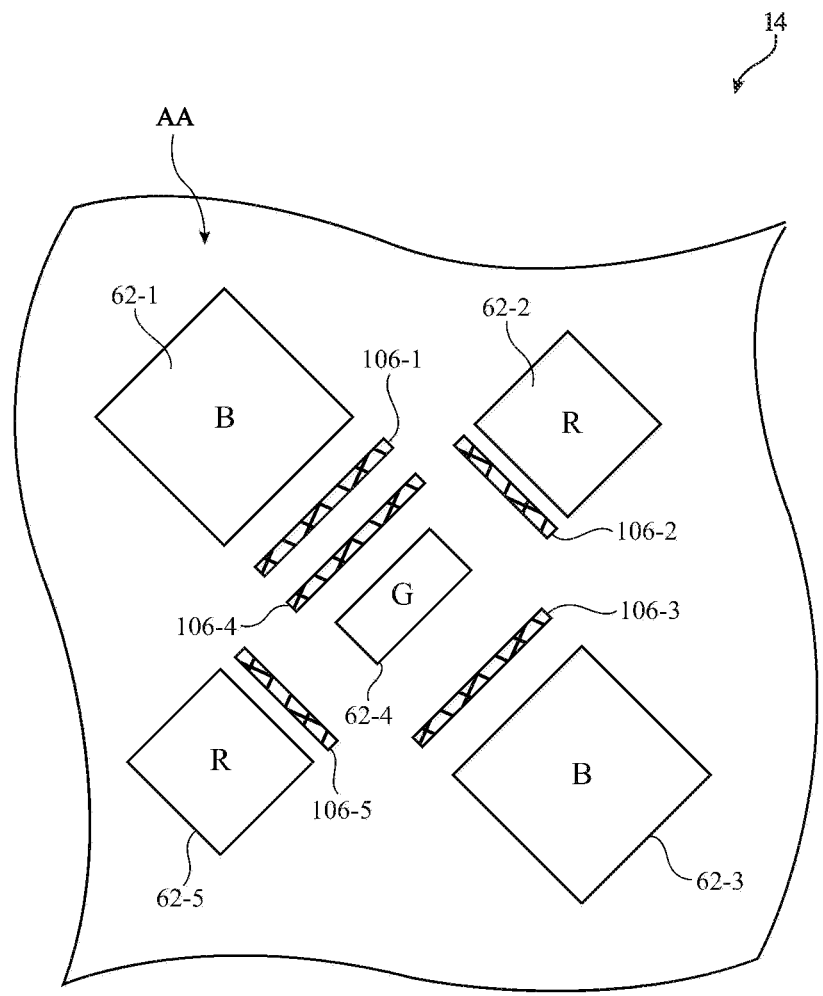
FIG. 18 is a top view of an illustrative display having per-color power supply lines in an active area of the display in accordance with some embodiments.

In alternate embodiments, shown in FIGS. 17 and 18, the power supply line 106 is moved into the active area of the display. As shown in FIG. 17, the power supply line 106 may be interposed between adjacent emissive sub-pixels 62 in active area AA of display 14. In the example of FIG. 17, the power supply line provides the same power supply voltage to a common cathode 102 for the array of emissive sub-pixels. The power supply line may be formed as a continuous mesh across the active area or may have two or more discrete portions. Each discrete portion may be electrically connected to the common cathode at least one respective point.

Instead of the power supply line in active area AA providing the same power supply voltage to a common cathode (as in FIG. 17), there may be per-color power supply lines in the active area that provide different power supply voltages to the cathodes of emissive sub-pixels of different colors. FIG. 18 is a top view of an illustrative display of this type.

In the example of FIG. 18, cathode 102 may be patterned to have a discrete portion for each emissive sub-pixel (e.g., similar to the anodes shown in FIGS. 14 and 15). A respective power supply line provides a respective power supply voltage to the cathode for each emissive sub-pixel. For example, power supply line 106-1 provides a first power supply voltage to the cathode for emissive sub-pixel 62-1, power supply line 106-2 provides a first power supply voltage to the cathode for emissive sub-pixel 62-2, power supply line 106-3 provides a first power supply voltage to the cathode for emissive sub-pixel 62-3, power supply line 106-4 provides a first power supply voltage to the cathode for emissive sub-pixel 62-4, and power supply line 106-5 provides a first power supply voltage to the cathode for emissive sub-pixel 62-5. Each emissive sub-pixel may be provided a power supply voltage based on its color (as one example). For example, all of the red emissive sub-pixels may be provided a first power supply voltage, all of the blue emissive sub-pixels may be provided a second power supply voltage, and all of the green emissive sub-pixels may be provided a third power supply voltage. The difference between a minimum of the first, second, and third power supply voltages and a maximum of the first, second, and third power supply voltages may be greater than 0.3 V, greater than 0.5 V, greater than 1.0 V, greater than 1.5 V, greater than 2.0 V, etc.

Shifting the power supply line into the active area of the display (as in FIGS. 17 and 18) reduces the width of the inactive border region of the display (because the power supply line does not need to be accommodated in the inactive border region).

Figure 19:
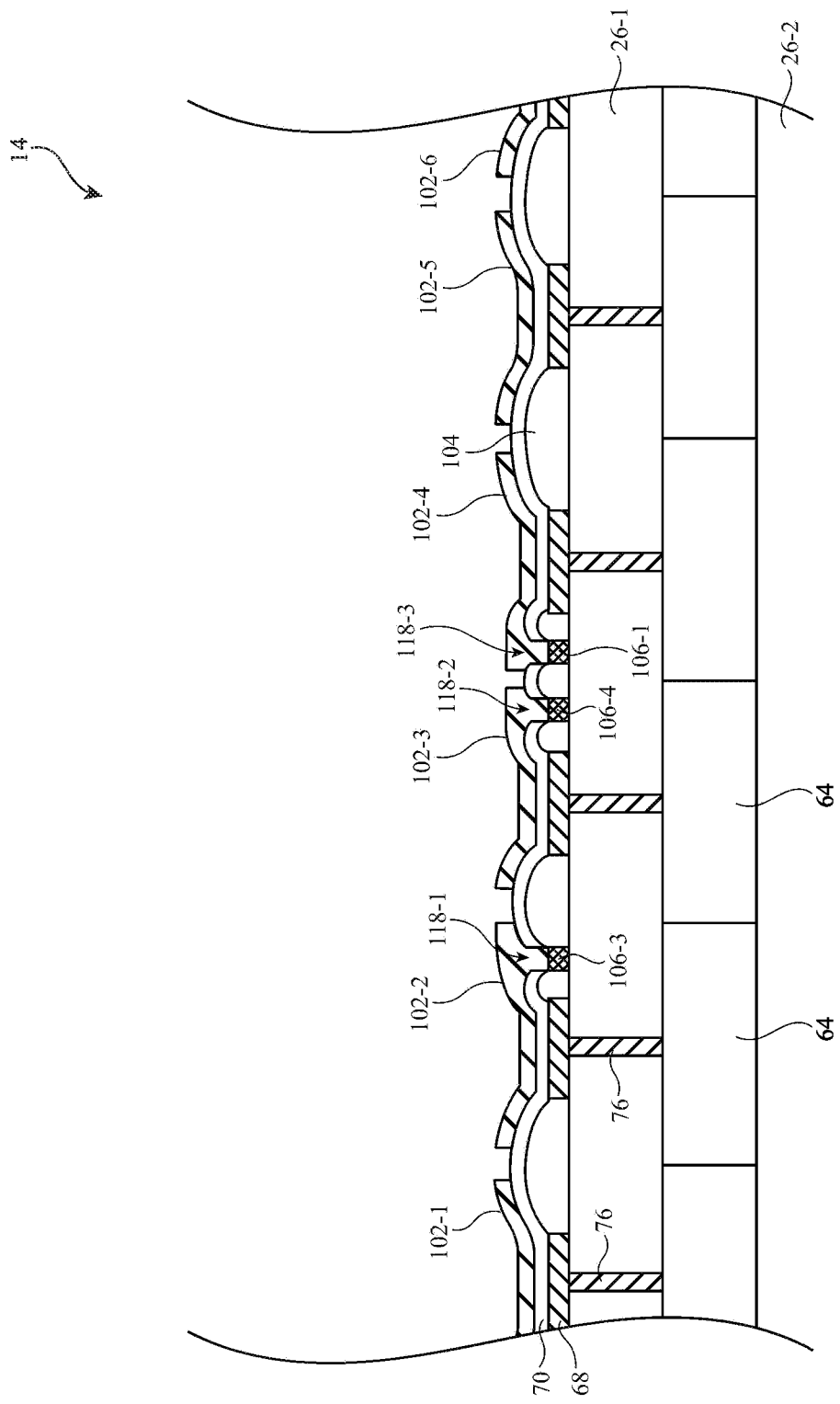
FIG. 19 is a cross-sectional side view of an illustrative display having per-color power supply lines in an active area of the display in accordance with some embodiments.

FIG. 19 is a cross-sectional side view of an illustrative display with per-color power supply lines (similar to as shown in FIG. 18). As shown in FIG. 19, the power supply lines (e.g., power supply lines 106-1, 106-3, and 106-4) may be formed on an upper substrate of substrate 26-1 (e.g., between anodes 68). The cathode is patterned to have a discrete cathode portion for each emissive sub-pixel. A first emissive sub-pixel has a discrete cathode portion 102-1, a second emissive sub-pixel has a discrete cathode portion 102-2, a third emissive sub-pixel has a discrete cathode portion 102-3, a fourth emissive sub-pixel has a discrete cathode portion 102-4, a fifth emissive sub-pixel has a discrete cathode portion 102-5, and a sixth emissive subpixel has a discrete cathode portion 102-6.

There may be openings in pixel definition layer 104 and/or OLED layers 70 that allow electrical connection between each power supply line and a respective cathode portion. For example, a first opening 118-1 allows for an electrical connection between power supply line 106-3 and cathode portion 102-2. A second opening 118-2 allows for an electrical connection between power supply line 106-4 and cathode portion 102-3. A third opening 118-3 allows for an electrical connection between power supply line 106-1 and cathode portion 102-4.

Each opening 118 may be formed using a laser drilling process in one possible embodiment. In other words, pixel definition layer 104 and/or OLED layers 70 are deposited over the power supply lines. A laser is then used to drill an opening (via) through the layers (e.g., pixel definition layer 104 and/or OLED layers 70) over the power supply lines. The subsequently deposited cathode then contacts the power supply lines through the openings.

In another possible embodiment, each opening 118 may be defined by layers 70 and 104 during a patterning process. In other words, layers 70 and 104 may be deposited in a pattern to leave openings 118 over the power supply lines (without a laser drilling step required). The subsequently deposited cathode then contacts the power supply lines through the openings.

The vias in FIG. 19 for connecting a power supply line to a cathode may also be used in a display of the type shown in FIG. 17 (with a power supply line in active area AA providing the same power supply voltage to a common cathode).

The foregoing is merely illustrative and various modifications can be made by those skilled in the art without departing from the scope and spirit of the described embodiments. The foregoing embodiments may be implemented individually or in any combination.

What is claimed is:

1. A display with first and second opposing edges, the display comprising:
   a plurality of pixels arranged in a light-emitting area, wherein the light-emitting area extends from the first edge to the second edge, wherein each one of the plurality of pixels includes an emissive sub-pixel and a thin-film transistor sub-pixel that controls the emissive sub-pixel, wherein each emissive sub-pixel includes an anode and a cathode, and wherein the emissive sub-pixels have a uniform density across the entire light-emitting area;
   a plurality of data lines;
   a plurality of gate lines;
   display driver circuitry that is configured to provide data to the plurality of pixels using the plurality of data lines;
   gate driver circuitry that is configured to provide control signals to the plurality of pixels using the plurality of gate lines, wherein at least a portion of the gate driver circuitry is positioned in the light-emitting area;
   a first power supply line in the light-emitting area that provides a first power supply voltage with a first magnitude to a first cathode for a first emissive sub-pixel of a first color;
   a second power supply line in the light-emitting area that provides a second power supply voltage with a second magnitude to a second cathode for a second emissive sub-pixel of a second color, wherein the second magnitude is different than the first magnitude; and
   a third power supply line in the light-emitting area that provides a third power supply voltage with a third magnitude to a third cathode for a third emissive sub-pixel of a third color, wherein the third magnitude is different than the first and second magnitudes and wherein a difference between a minimum of the first, second, and third magnitudes and a maximum of the first, second, and third magnitudes is greater than 0.5 V.

2. The display defined in claim 1, wherein the thin-film transistor sub-pixels have a portion with a second density that is greater than the uniform density of the emissive sub-pixels.

3. The display defined in claim 2, wherein the thin-film transistor sub-pixels have a portion with a third density that is different than the second density.

4. The display defined in claim 2, wherein the thin-film transistor sub-pixels have a uniform density.

5. The display defined in claim 1, wherein a subset of the emissive sub-pixels overlaps the gate driver circuitry, wherein a subset of the thin-film transistor sub-pixels controls the subset of the emissive sub-pixels, wherein the thin-film transistor sub-pixels are arranged in an array, and wherein the subset of the thin-film transistor sub-pixels is consolidated at an edge of the array.

6. The display defined in claim 1, wherein a subset of the emissive sub-pixels overlaps the gate driver circuitry, wherein a subset of the thin-film transistor sub-pixels controls the subset of the emissive sub-pixels, wherein the thin-film transistor sub-pixels are arranged in an array and wherein the subset of the thin-film transistor sub-pixels is evenly distributed across the array.

7. The display defined in claim 1, wherein the first color is red, the second color is green, and the third color is blue.

8. A display comprising:
   a plurality of pixels arranged in a light-emitting area, wherein the light-emitting area has an edge and wherein each one of the plurality of pixels includes an emissive sub-pixel and a thin-film transistor sub-pixel that controls the emissive sub-pixel;
   a plurality of data lines;
   a plurality of gate lines;
   display driver circuitry that is configured to provide data to the plurality of pixels using the plurality of data lines; and
   gate driver circuitry that is configured to provide control signals to the plurality of pixels using the plurality of gate lines, wherein at least a portion of the gate driver circuitry is positioned in the light-emitting area, wherein the portion of the gate driver circuitry is positioned at the edge, wherein a subset of the emissive sub-pixels overlaps the gate driver circuitry, wherein the subset of the emissive sub-pixels is positioned at the edge, wherein a subset of the thin-film transistor sub-pixels controls the subset of the emissive sub-pixels, wherein the thin-film transistor sub-pixels are arranged in an array, wherein at least one thin-film transistor sub-pixel that is not part of the subset of the thin-film transistor sub-pixels is interposed between a thin-film transistor sub-pixel in the subset of the thin-film transistor sub-pixels and the edge.

9. The display defined in claim 8, further comprising:
   conductive paths that electrically connect the thin-film transistor subpixels to the emissive sub-pixels.

10. The display defined in claim 8, wherein at least one thin-film transistor sub-pixel that is part of the subset of the thin-film transistor sub-pixels is located in the center of the array of thin-film transistor sub-pixels.

11. The display defined in claim 8, wherein a plurality of thin-film transistor sub-pixels in the subset of thin-film transistor sub-pixels is evenly distributed throughout the array of thin-film transistor sub-pixels.

12. The display defined in claim 8, wherein a plurality of thin-film transistor sub-pixels in the subset of thin-film transistor sub-pixels is randomly distributed throughout the array of thin-film transistor sub-pixels.

13. A display comprising:
a plurality of pixels arranged in a light-emitting area, wherein each one of the plurality of pixels includes an emissive sub-pixel and a thin-film transistor sub-pixel that controls the emissive sub-pixel;
a plurality of data lines;
a plurality of gate lines;
display driver circuitry that is configured to provide data to the plurality of pixels using the plurality of data lines;
gate driver circuitry that is configured to provide control signals to the plurality of pixels using the plurality of gate lines, wherein at least a portion of the gate driver circuitry is positioned in the light-emitting area, wherein each emissive sub-pixel includes an anode, and wherein the emissive sub-pixels share a common cathode;
a power supply line outside of the light-emitting area; and
a conductive routing layer that electrically connects the power supply line to the common cathode, wherein the emissive sub-pixels include organic light-emitting diode layers interposed between the anodes and the common cathode, wherein the organic light-emitting diode layers extend outside of the light-emitting area, wherein the common cathode contacts the conductive routing layer through a via in the organic light-emitting diode layers outside of the light-emitting area, and wherein the via is located above a portion of the gate driver circuitry.

14. The display defined in claim 13, wherein the display further comprises a substrate, wherein a region of the conductive routing layer is interposed between the substrate and the via, and wherein the substrate is interposed between the via and a portion of the gate driver circuitry.

15. A display with first and second opposing edges, the display comprising:
a plurality of pixels arranged in a light-emitting area, wherein the light-emitting area extends from the first edge to the second edge, wherein each one of the plurality of pixels includes an emissive sub-pixel and a thin-film transistor sub-pixel that controls the emissive sub-pixel, wherein each emissive sub-pixel includes an anode and a cathode, and wherein the emissive sub-pixels have a uniform density across the entire light-emitting area;
a plurality of data lines;
a plurality of gate lines;
display driver circuitry that is configured to provide data to the plurality of pixels using the plurality of data lines;
gate driver circuitry that is configured to provide control signals to the plurality of pixels using the plurality of gate lines, wherein at least a portion of the gate driver circuitry is positioned in the light-emitting area;
a first power supply line in the light-emitting area that provides a first power supply voltage to a first cathode for a first emissive sub-pixel of a first color;
a second power supply line in the light-emitting area that provides a second power supply voltage to a second cathode for a second emissive sub-pixel of a second color; and
a third power supply line in the light-emitting area that provides a third power supply voltage to a third cathode for a third emissive sub-pixel of a third color, wherein a difference between a minimum of the first, second, and third power supply voltages and a maximum of the first, second, and third power supply voltages is greater than 0.5 V.

* * * * *